(12) United States Patent
Yu et al.

(10) Patent No.: US 7,842,954 B2
(45) Date of Patent: Nov. 30, 2010

(54) ACTIVE MATRIX ARRAY STRUCTURE

(75) Inventors: Wei-Sheng Yu, Hsinchu (TW);
Kuo-Lung Fang, Hsinchu (TW);
Hsiang-Lin Lin, Hsinchu (TW);
Hsien-Chieh Tseng, Hsinchu (TW);
Han-Tu Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/775,493

(22) Filed: May 7, 2010

(65) Prior Publication Data

US 2010/0213464 A1    Aug. 26, 2010

Related U.S. Application Data

(62) Division of application No. 12/102,027, filed on Apr. 14, 2008, now Pat. No. 7,754,547.

(30) Foreign Application Priority Data

Jan. 8, 2008    (TW)    .............................. 97100663 A

(51) Int. Cl.
*H01L 33/00* (2010.01)

(52) U.S. Cl. ......................................... 257/59; 257/72

(58) Field of Classification Search .................. 257/59, 257/72; 438/158, 689
See application file for complete search history.

(56) References Cited

U.S. PATENT DOCUMENTS 7,754,547 B2 *    7/2010    Yu et al. ..................... 438/158

* cited by examiner

*Primary Examiner*—Mark Prenty
(74) *Attorney, Agent, or Firm*—Jianq Chyun IP Office

(57) ABSTRACT

An active matrix array structure, disposed on a substrate, includes a first patterned conductive layer, a patterned gate insulating layer, a patterned semiconductor layer, a second patterned conductive layer, a patterned overcoat layer and a transparent conductive layer. The patterned gate insulating layer has first openings that expose a part of the first patterned conductive layer. The patterned semiconductor layer is disposed on the patterned gate insulating layer. The second patterned conductive layer is disposed on the patterned semiconductor layer. The patterned overcoat layer has second openings that expose a part of the first patterned conductive layer and a part of the second patterned conductive layer. The transparent conductive layer is completely disposed on the substrate. The transparent conductive layer disposed in the first openings and the second openings is broken off at a position that is in between the substrate and the patterned overcoat layer.

23 Claims, 38 Drawing Sheets

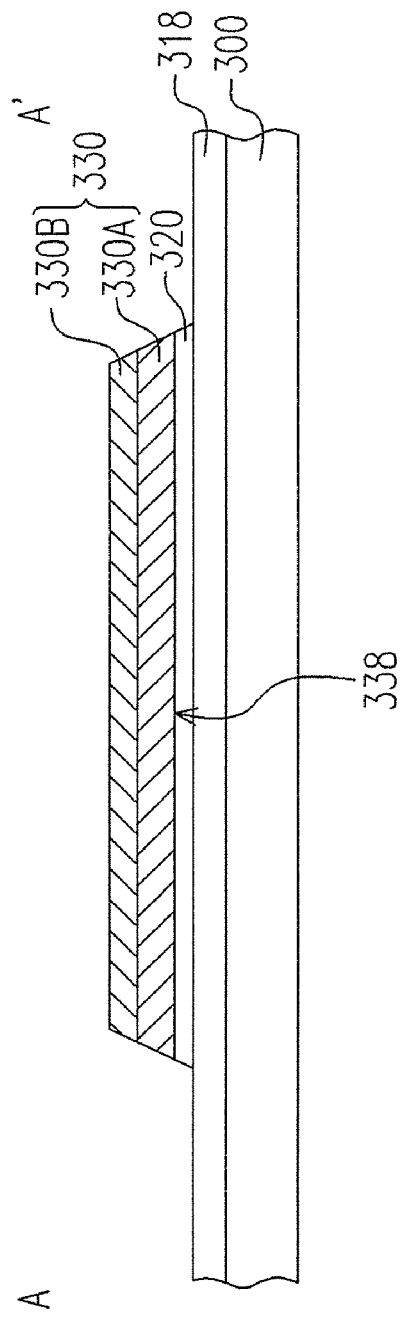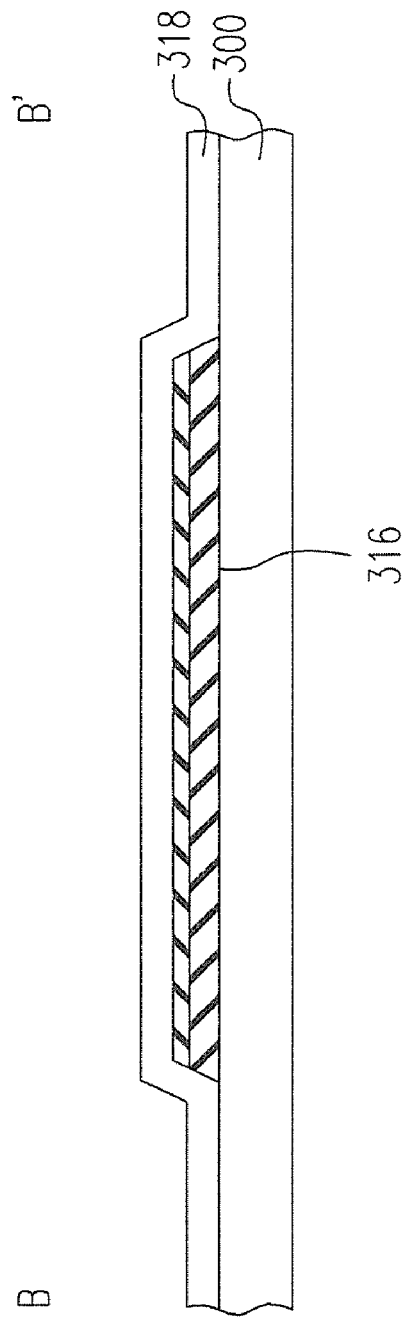

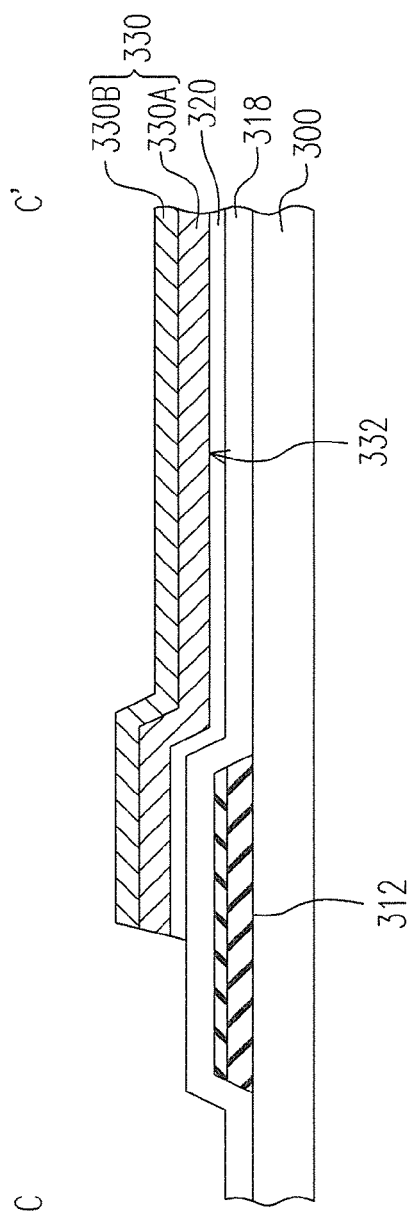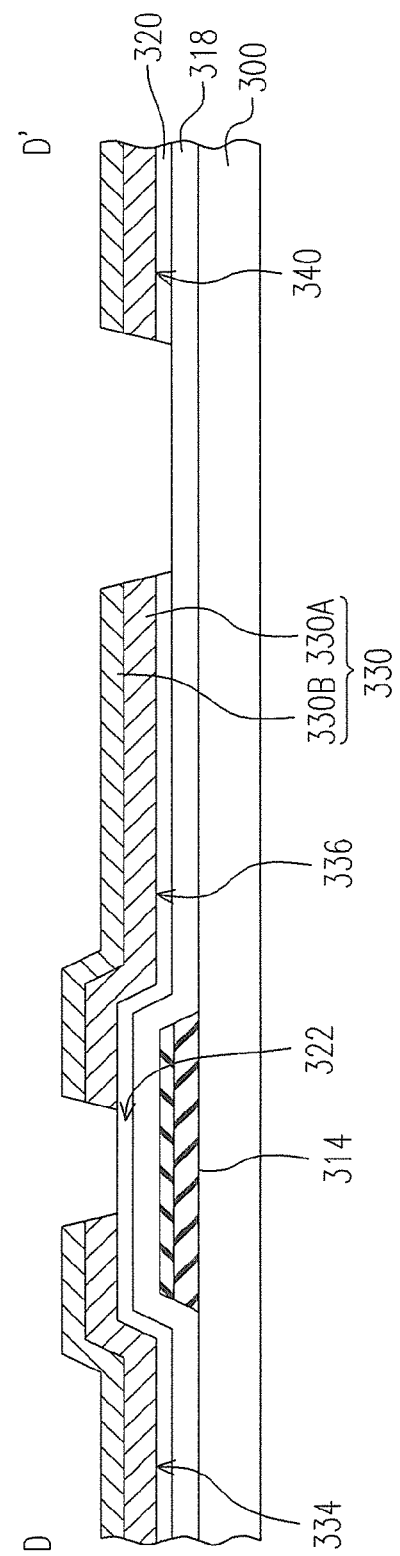

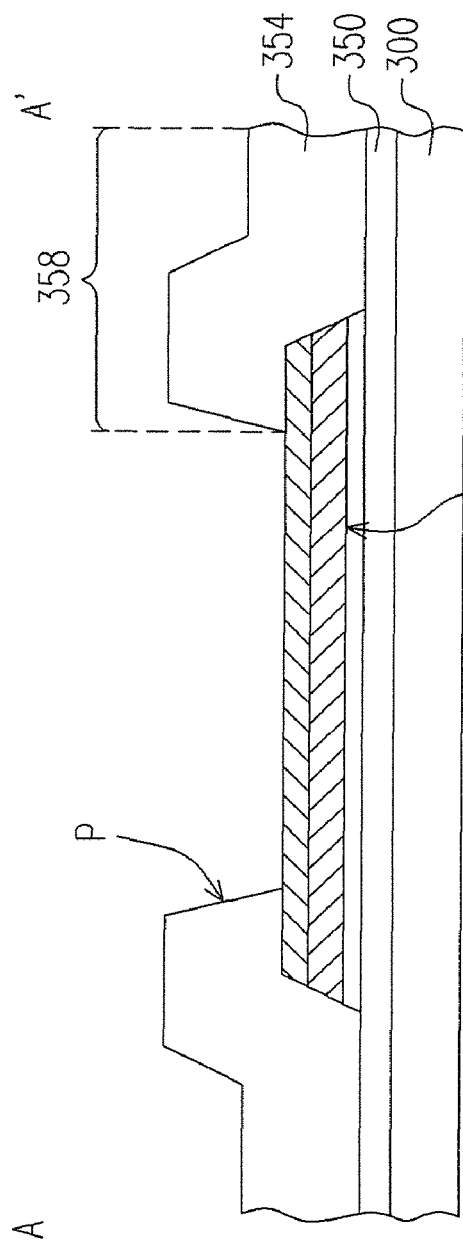
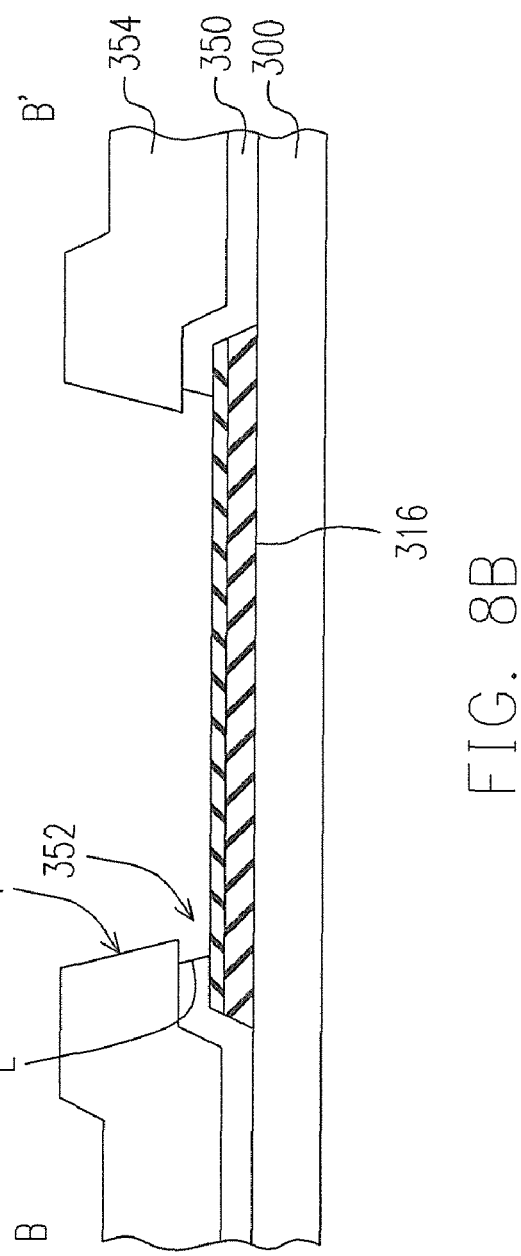

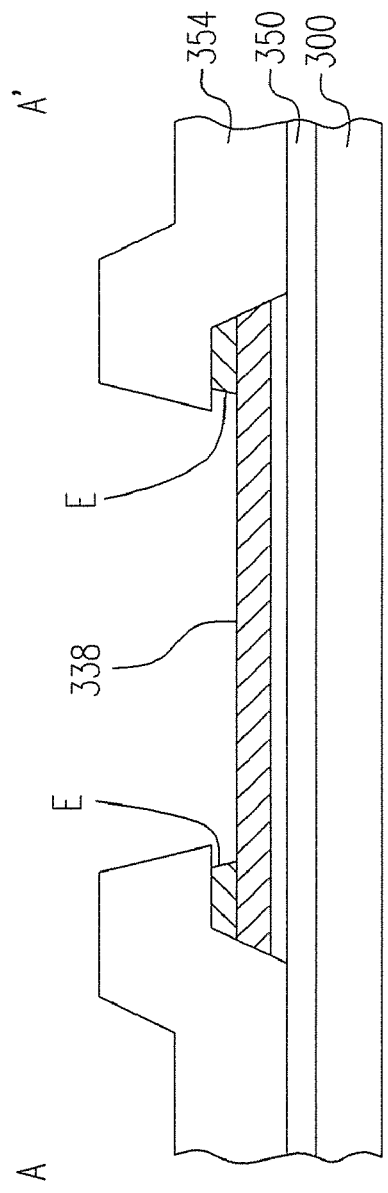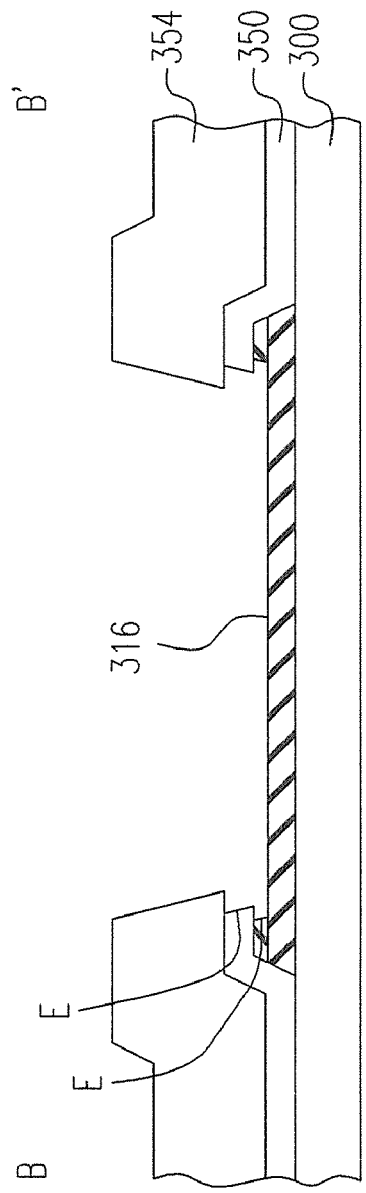

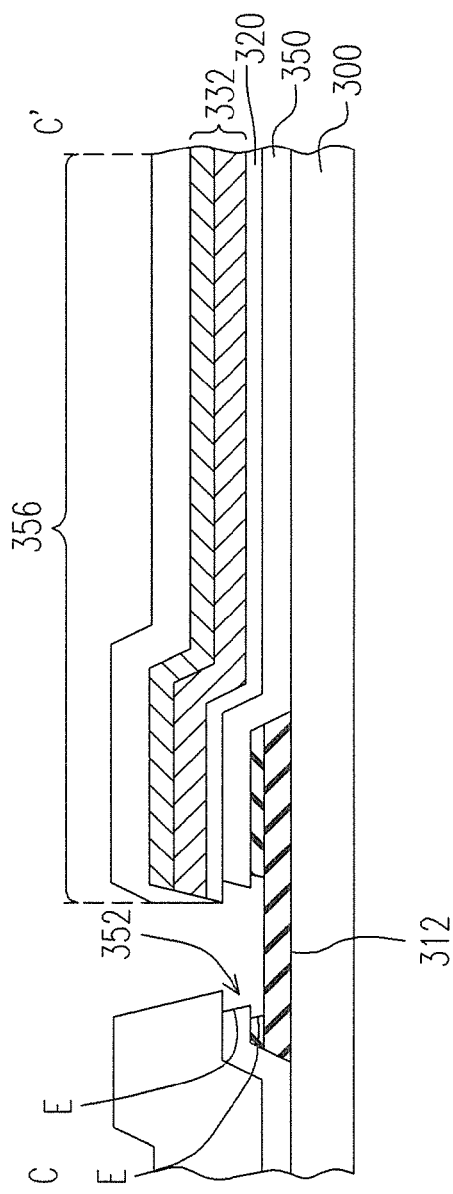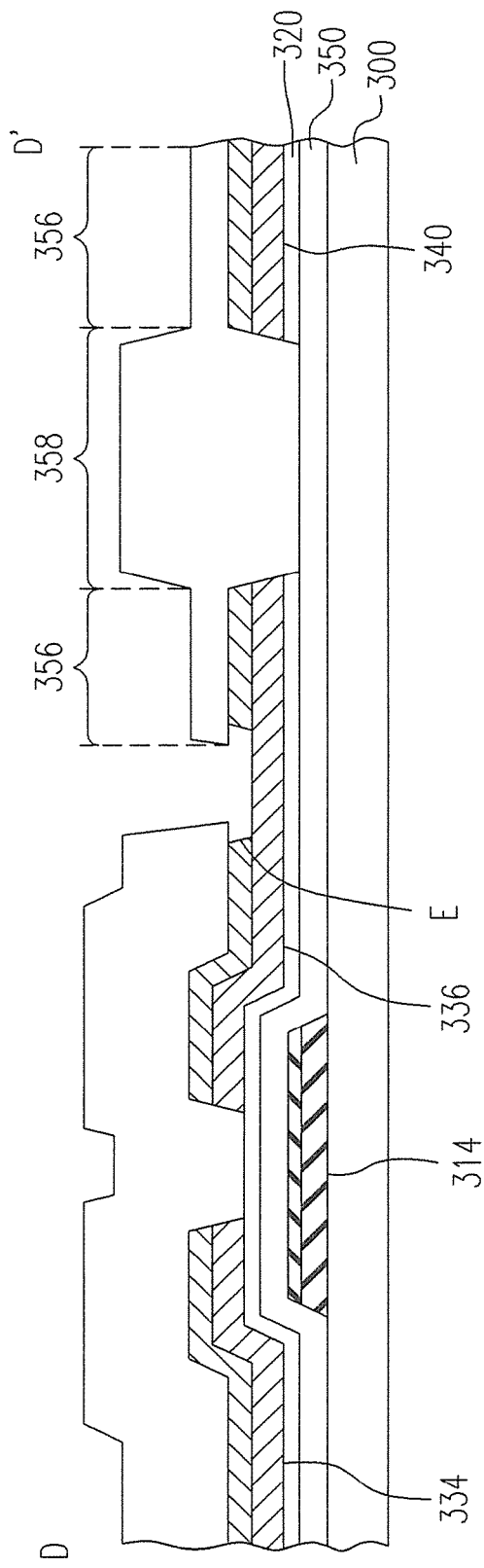

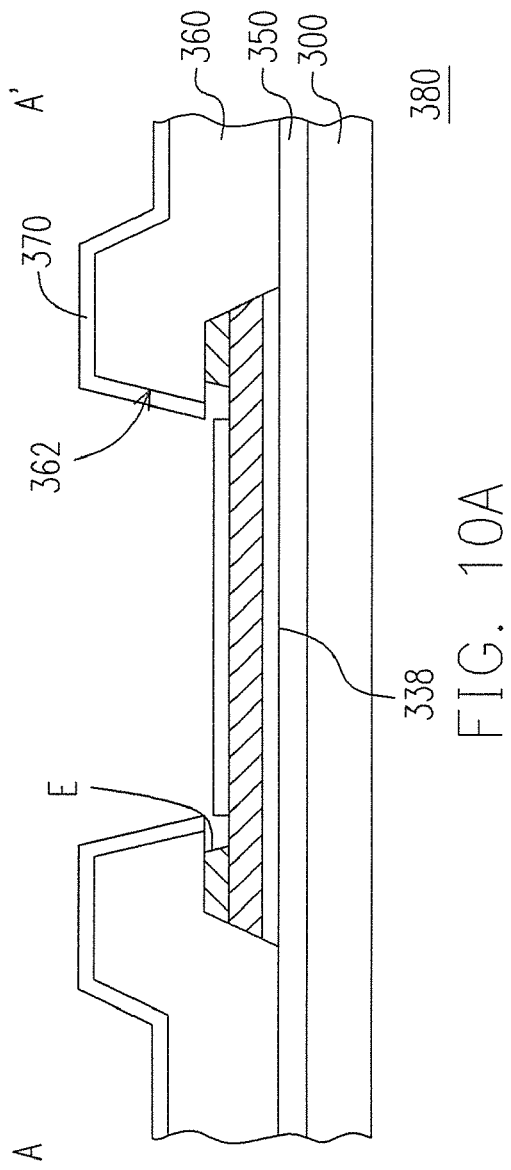
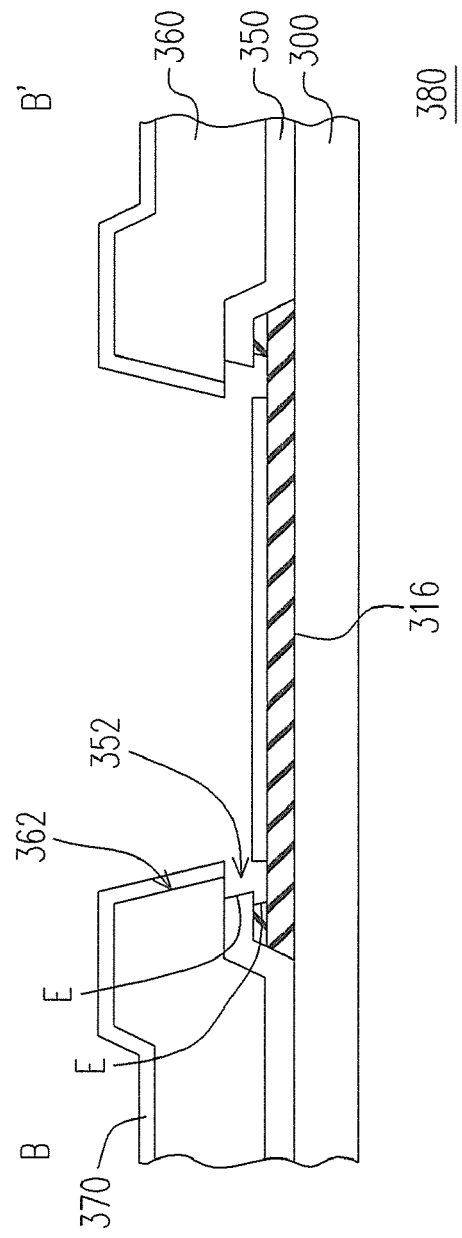

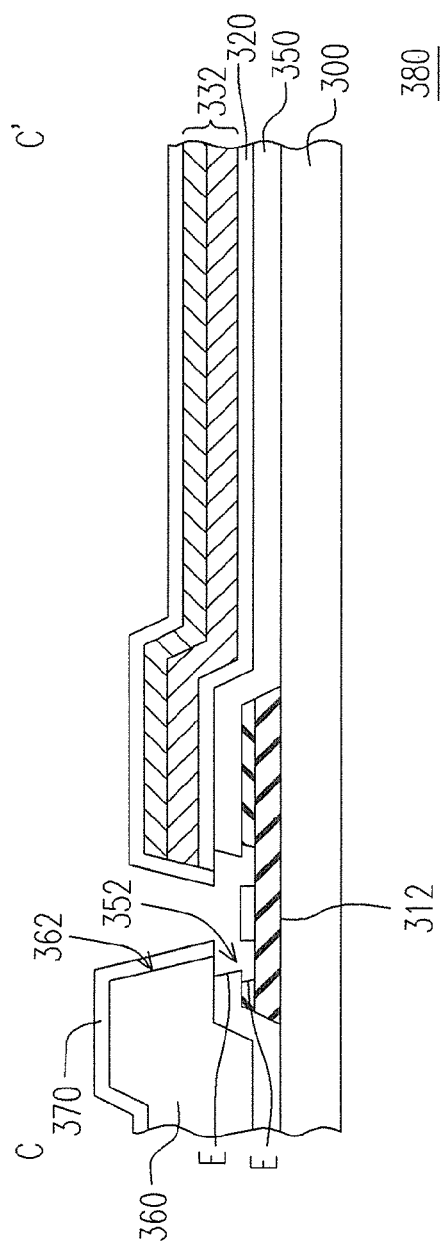
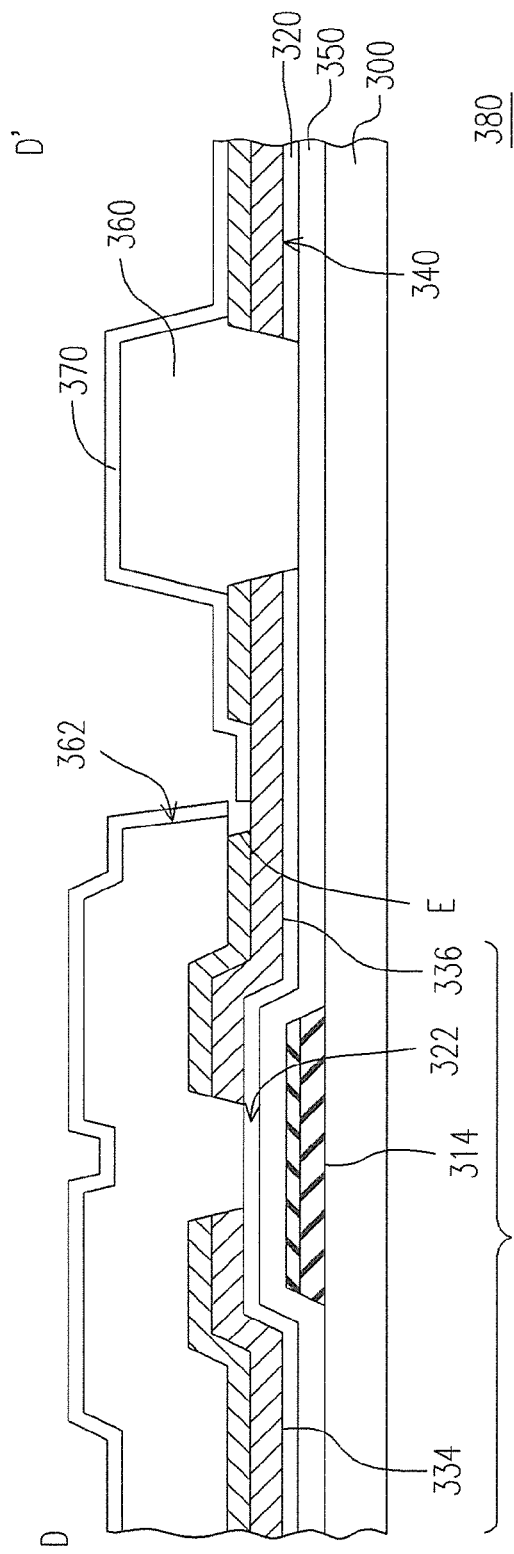
FIG. 10C
FIG. 10D

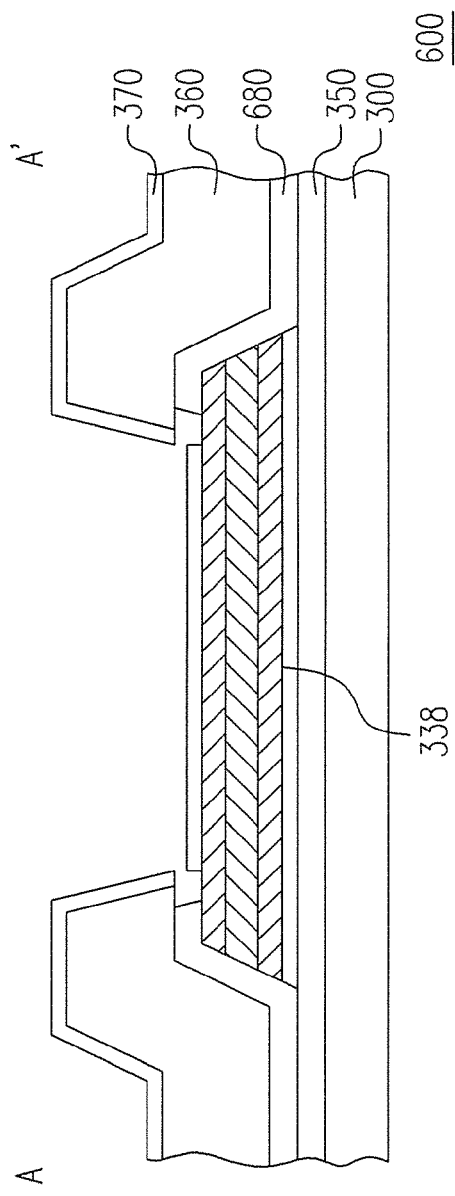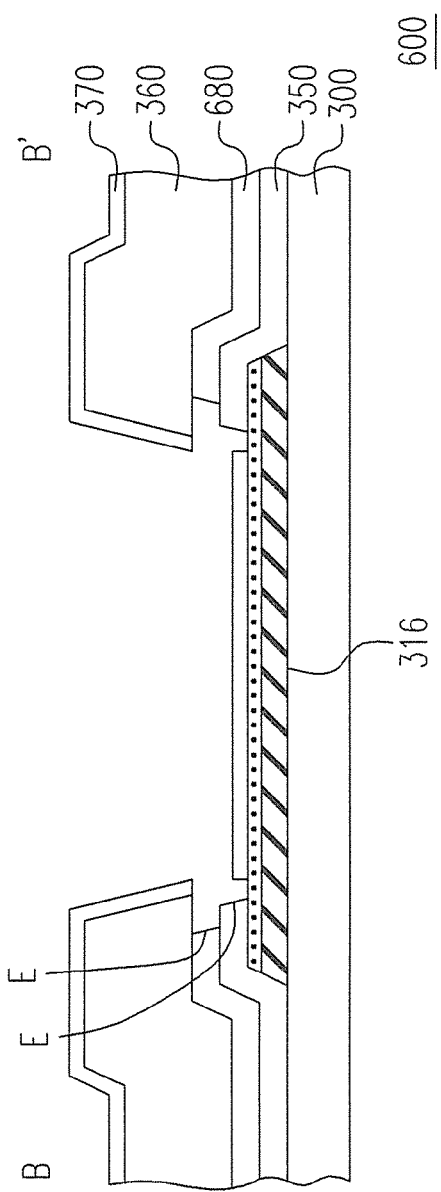

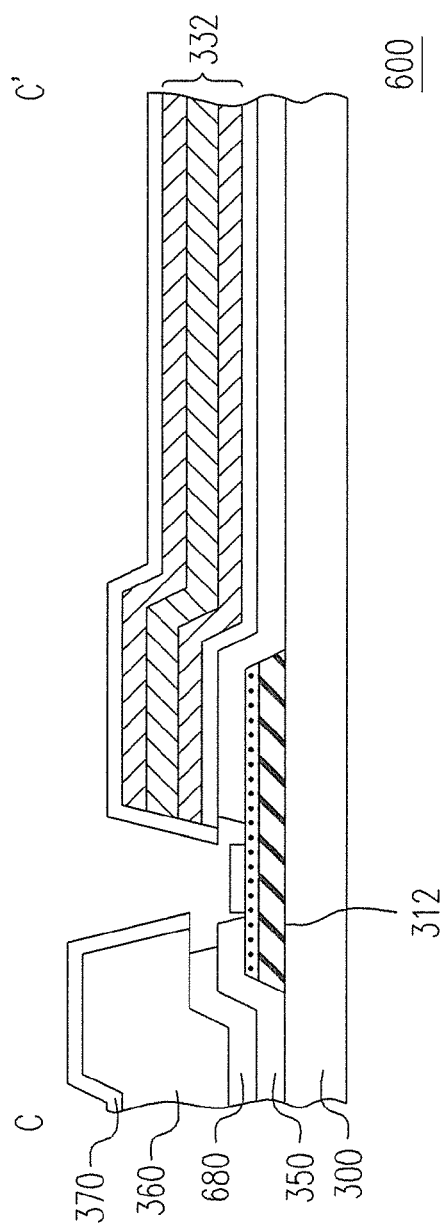
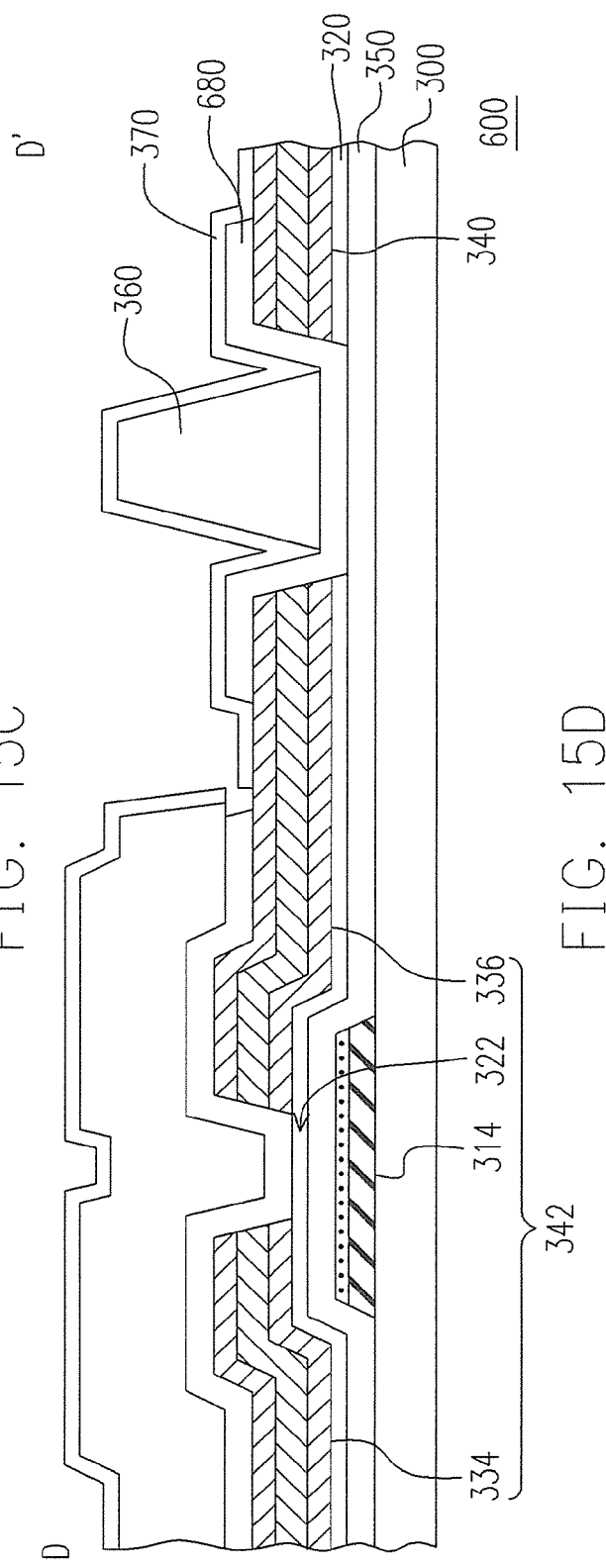
FIG. 15C
FIG. 15D

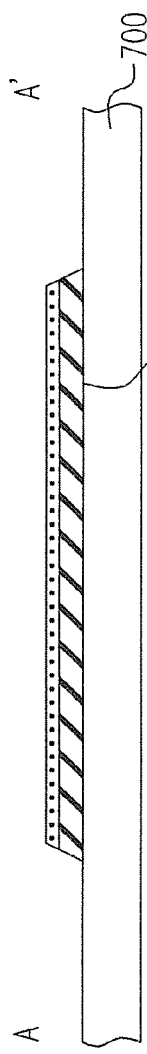
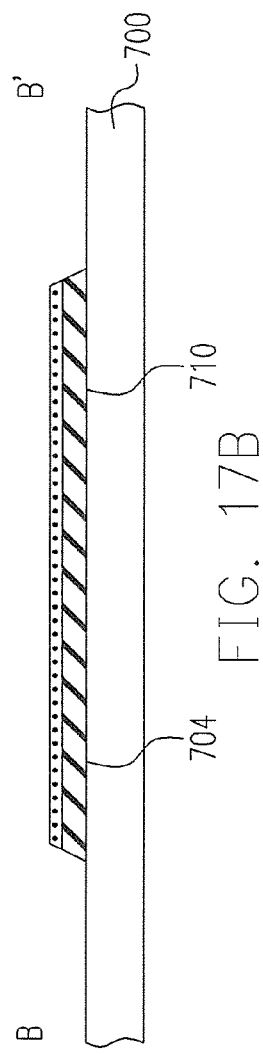
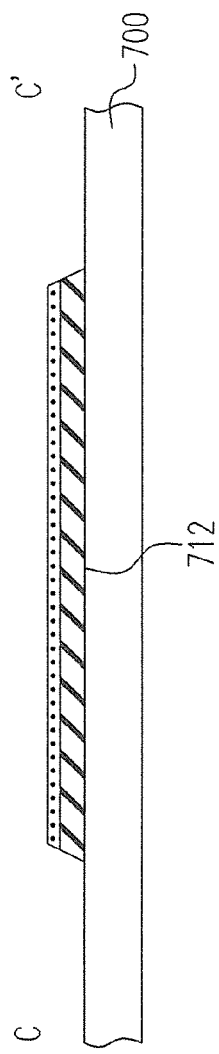
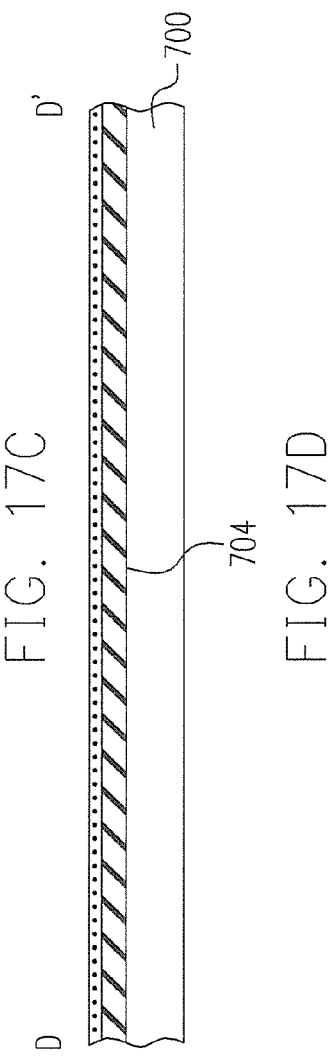
FIG. 17A
FIG. 17B
FIG. 17C
FIG. 17D

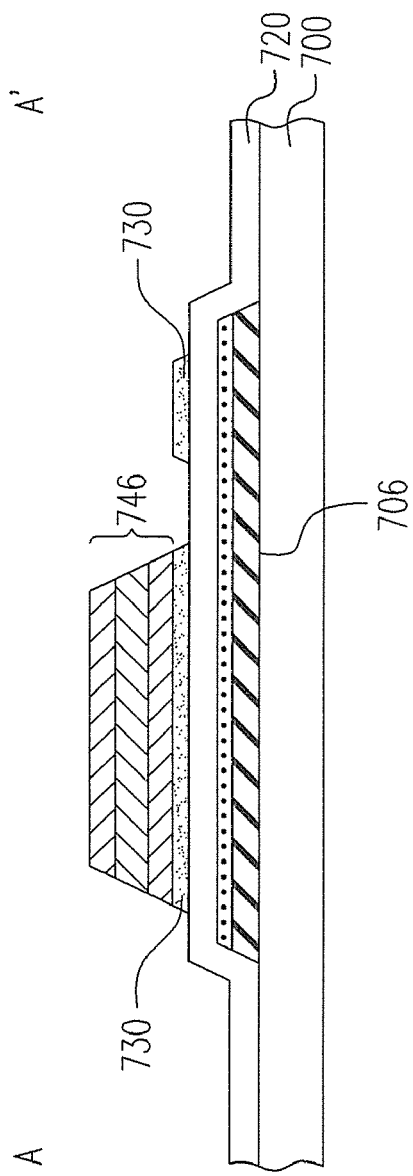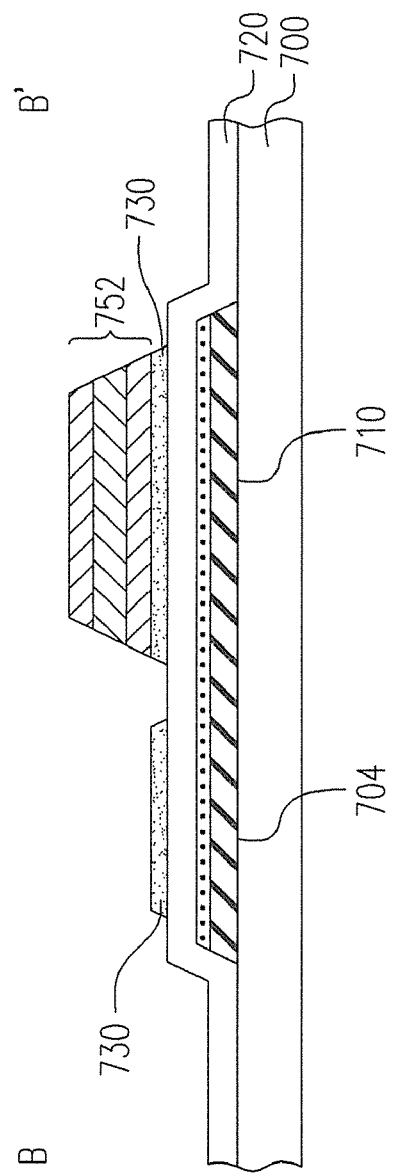

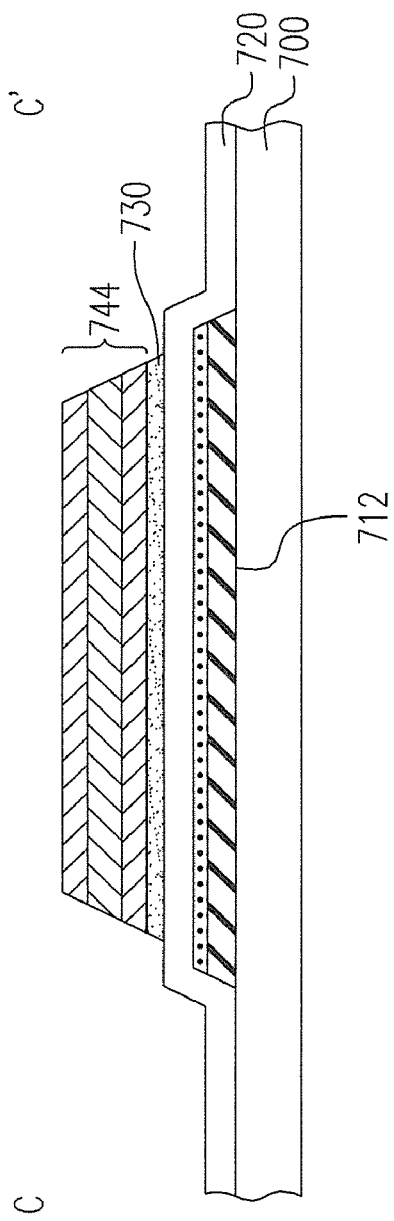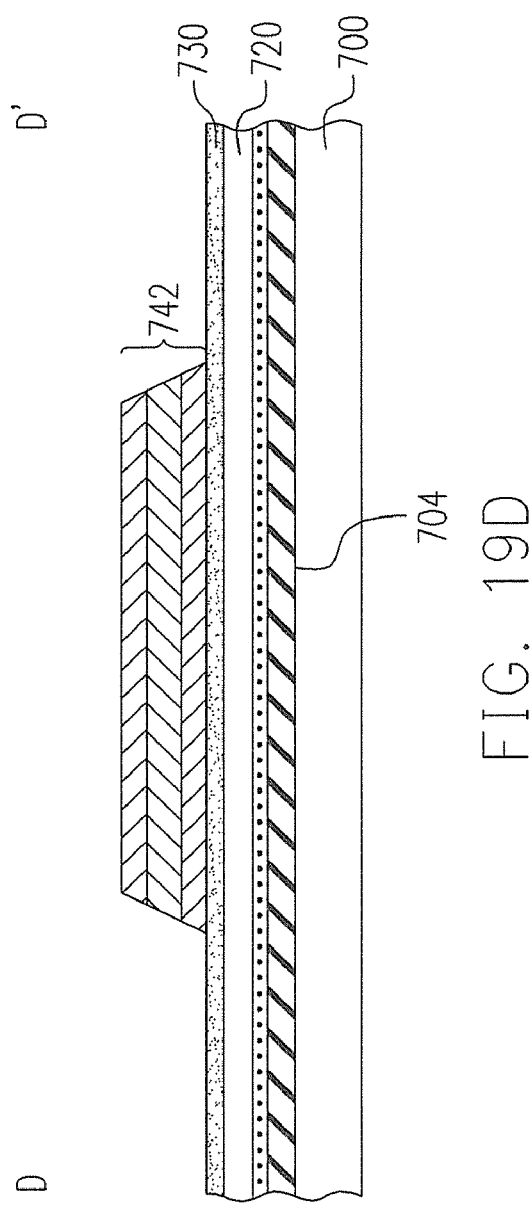

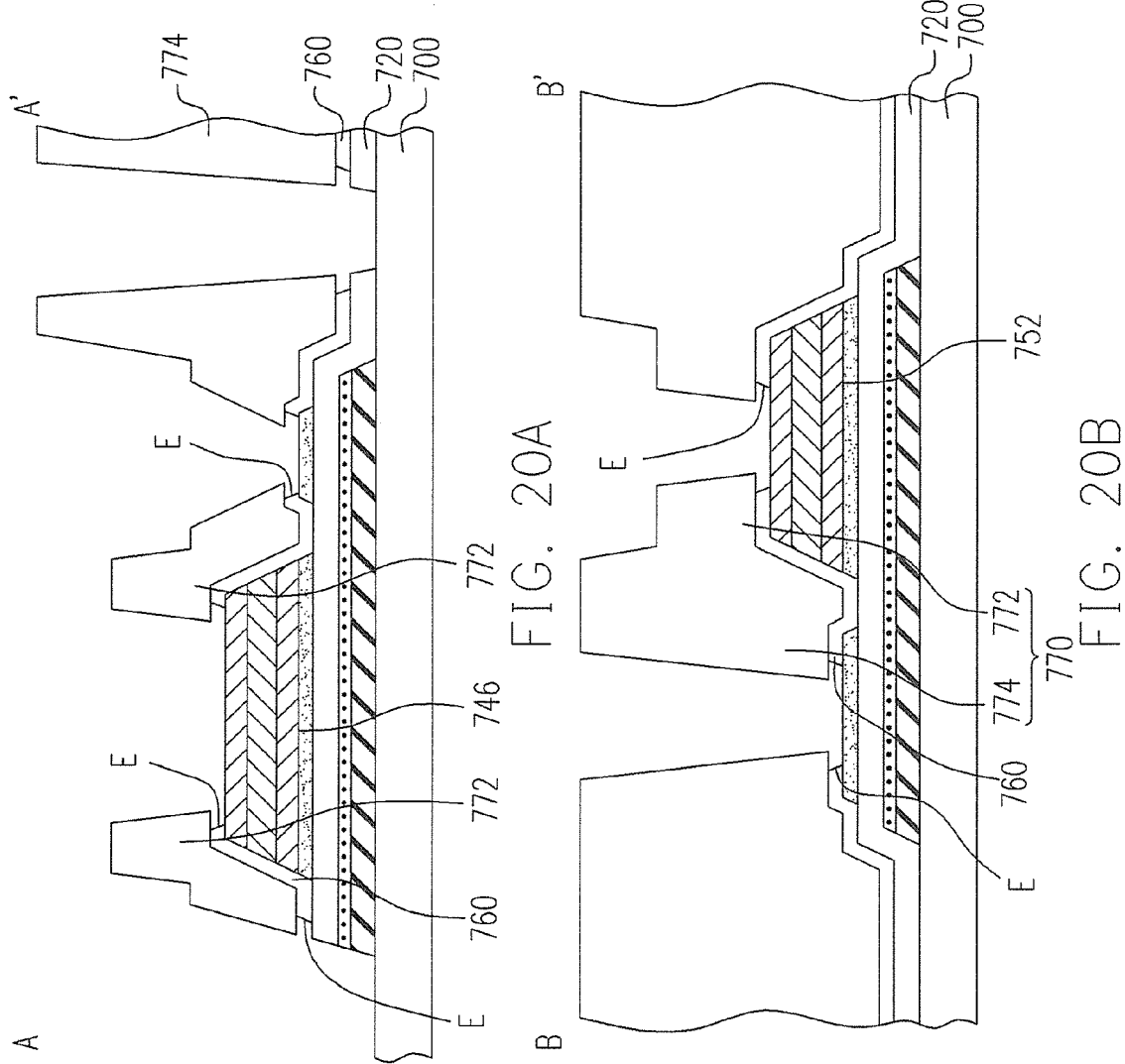

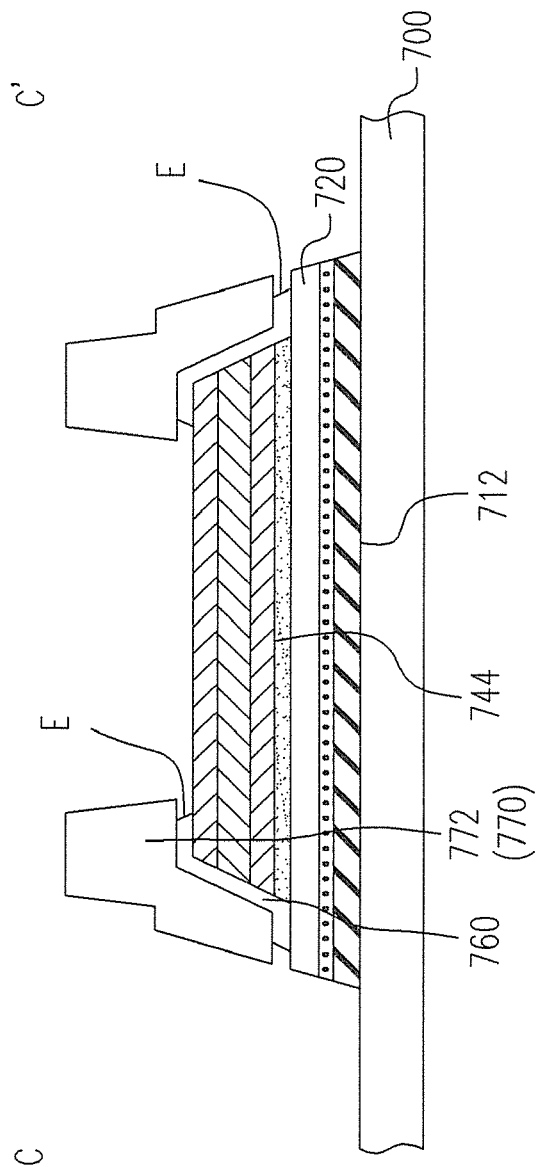
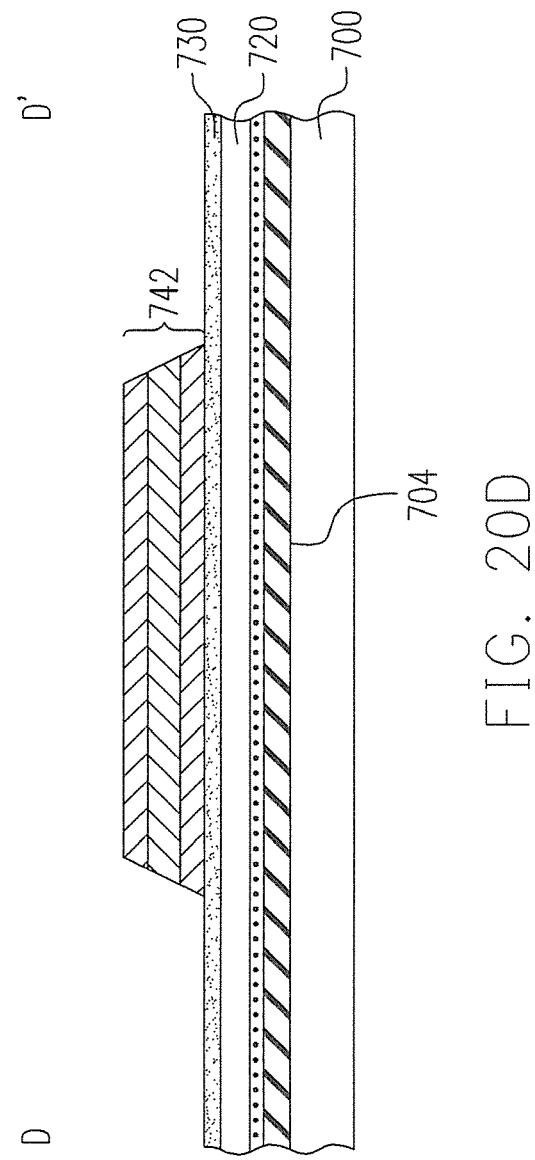
FIG. 20C
FIG. 20D

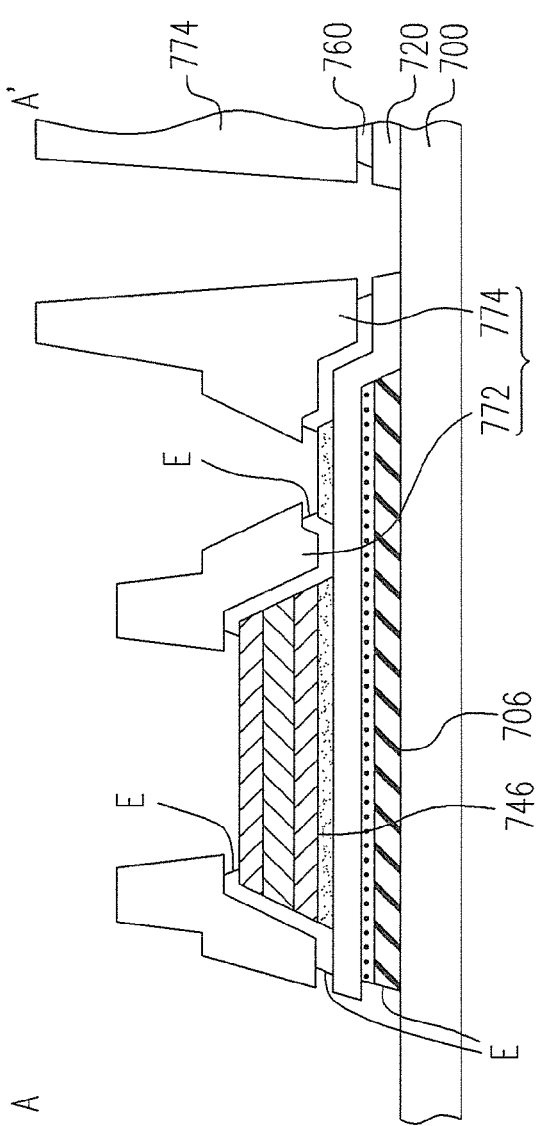
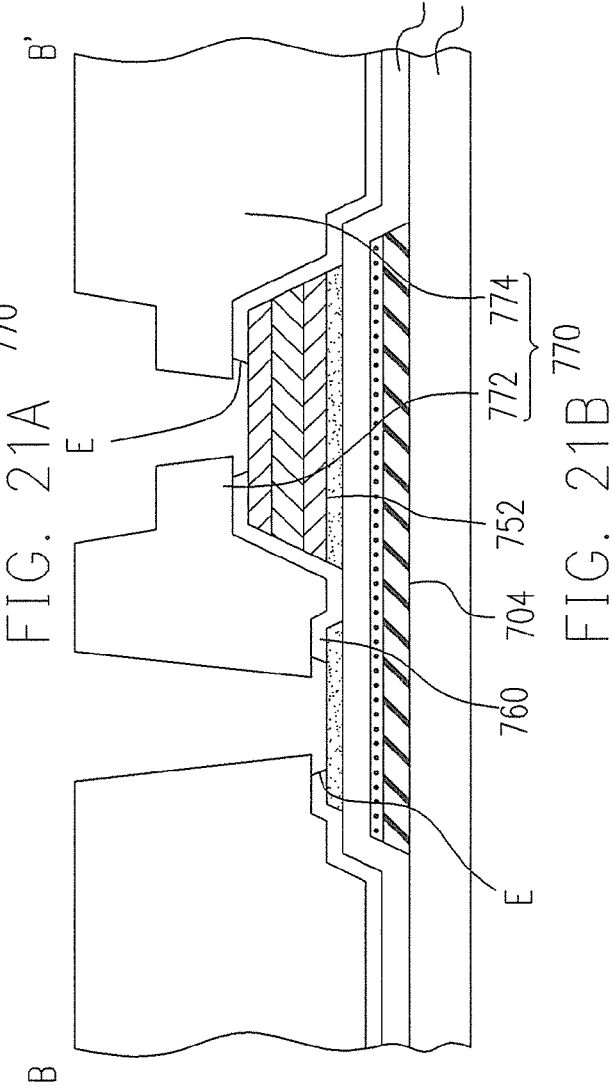
FIG. 21A
FIG. 21B

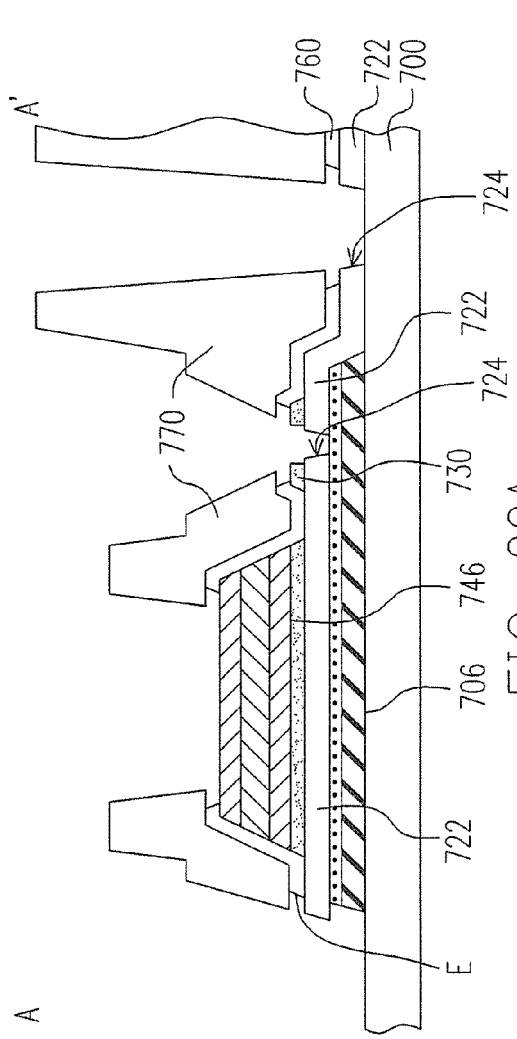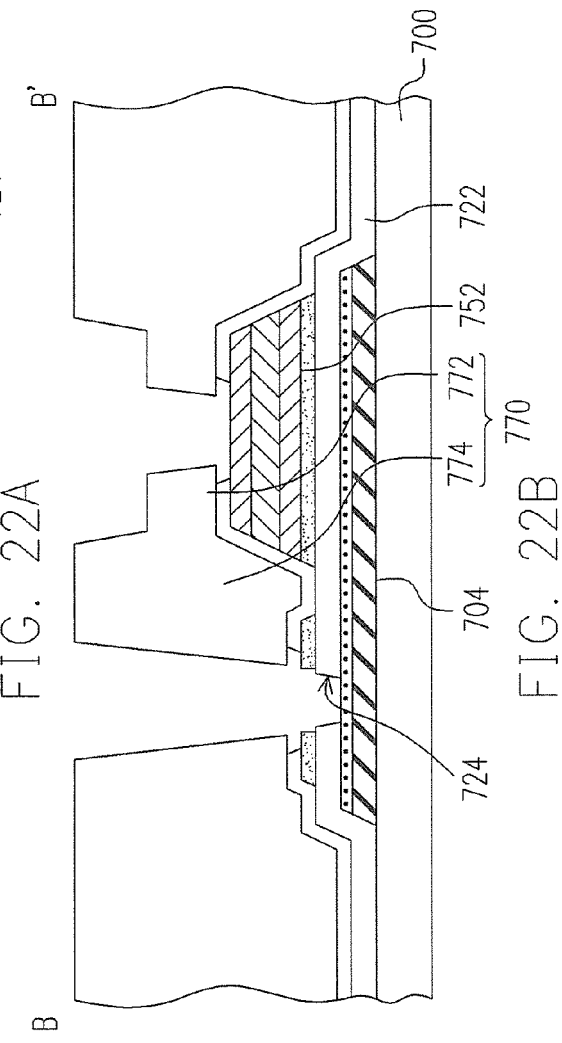

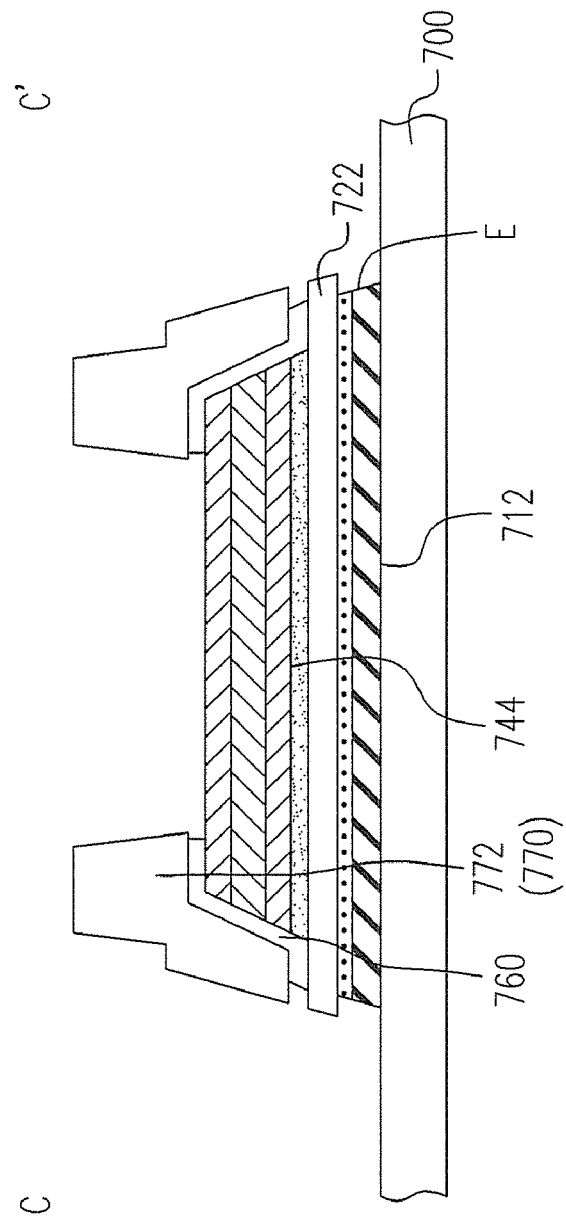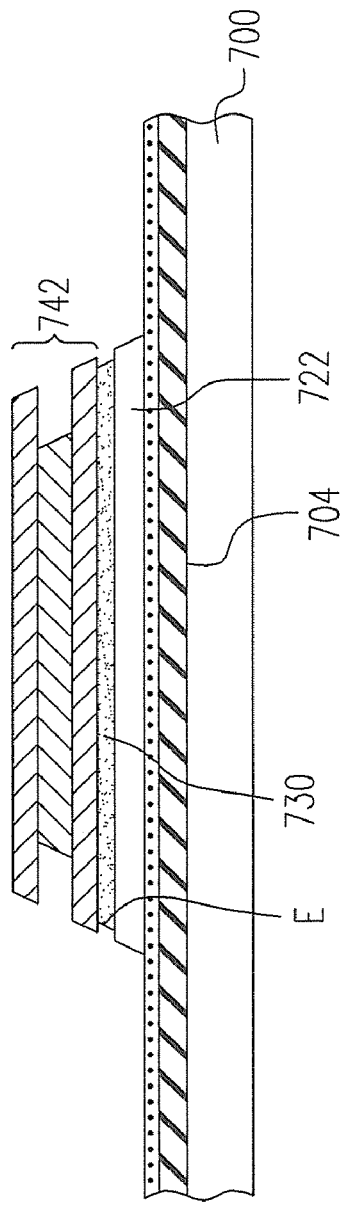
FIG. 22C
FIG. 22D

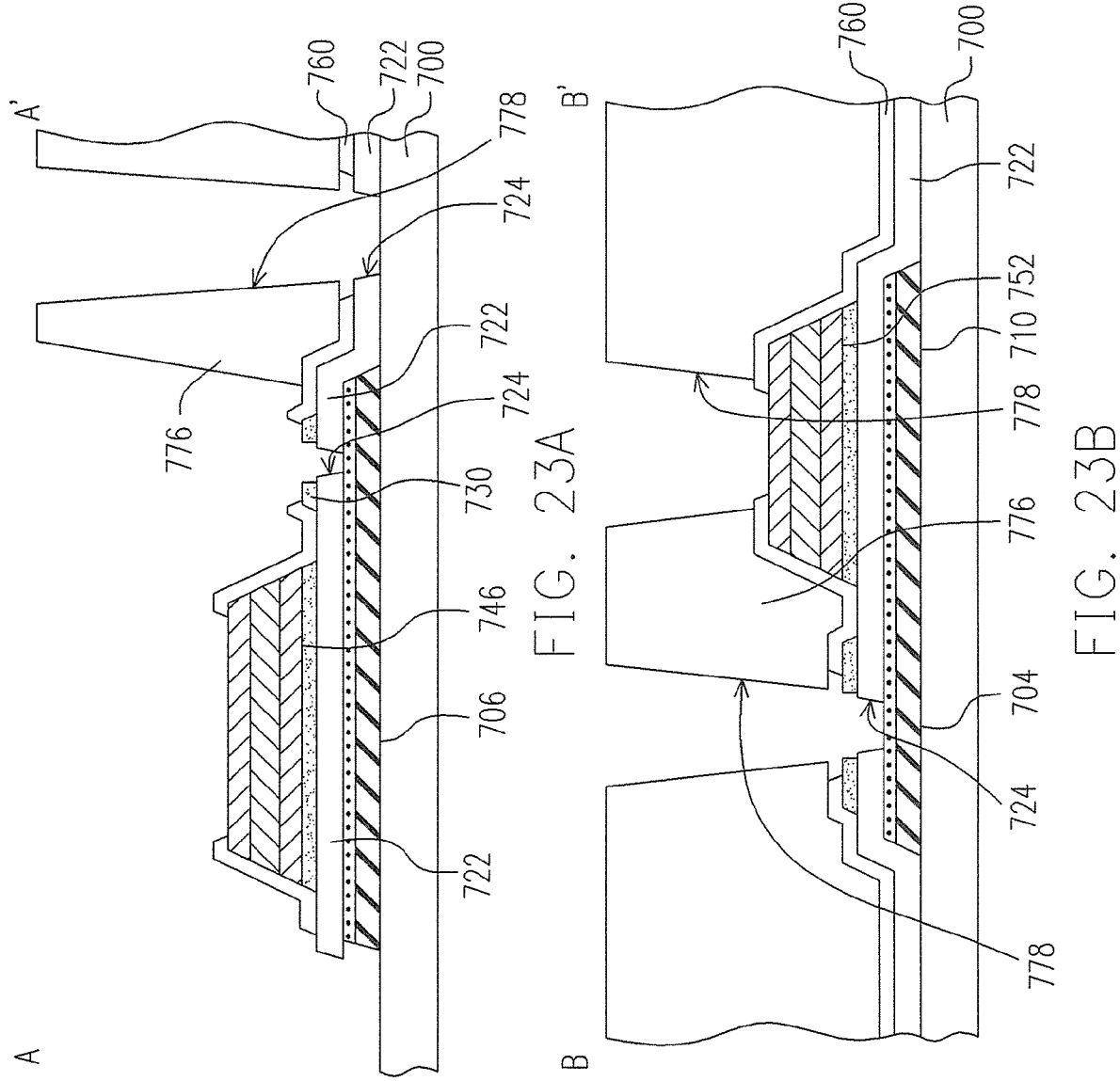

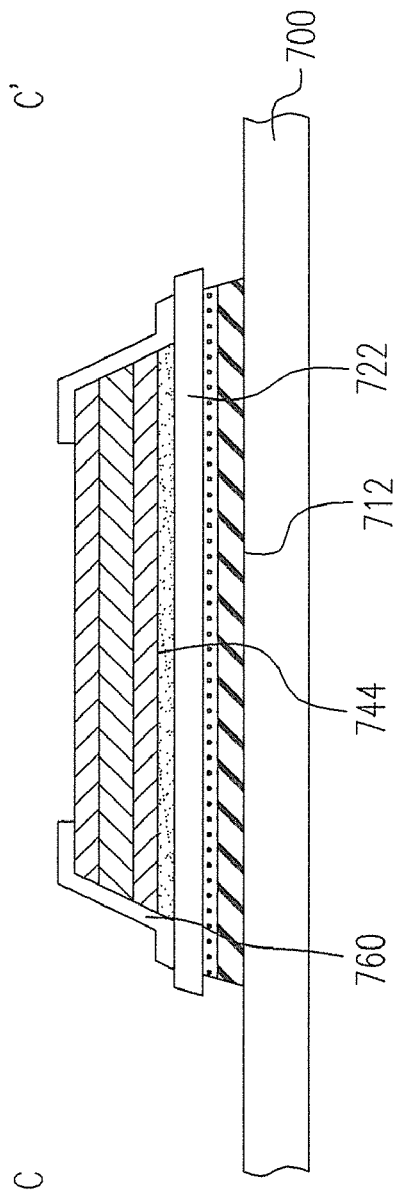
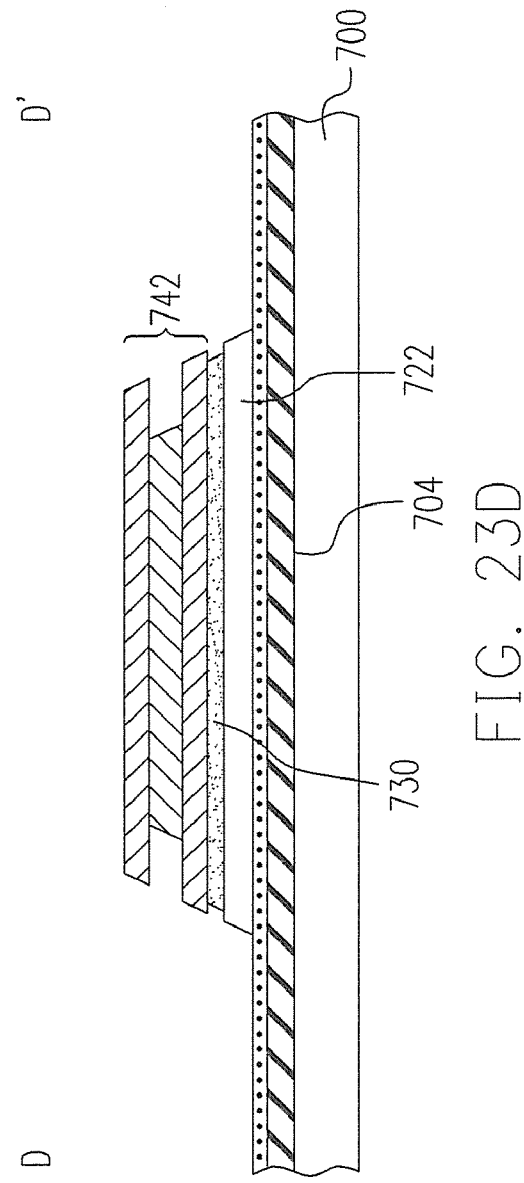
FIG. 23C
FIG. 23D

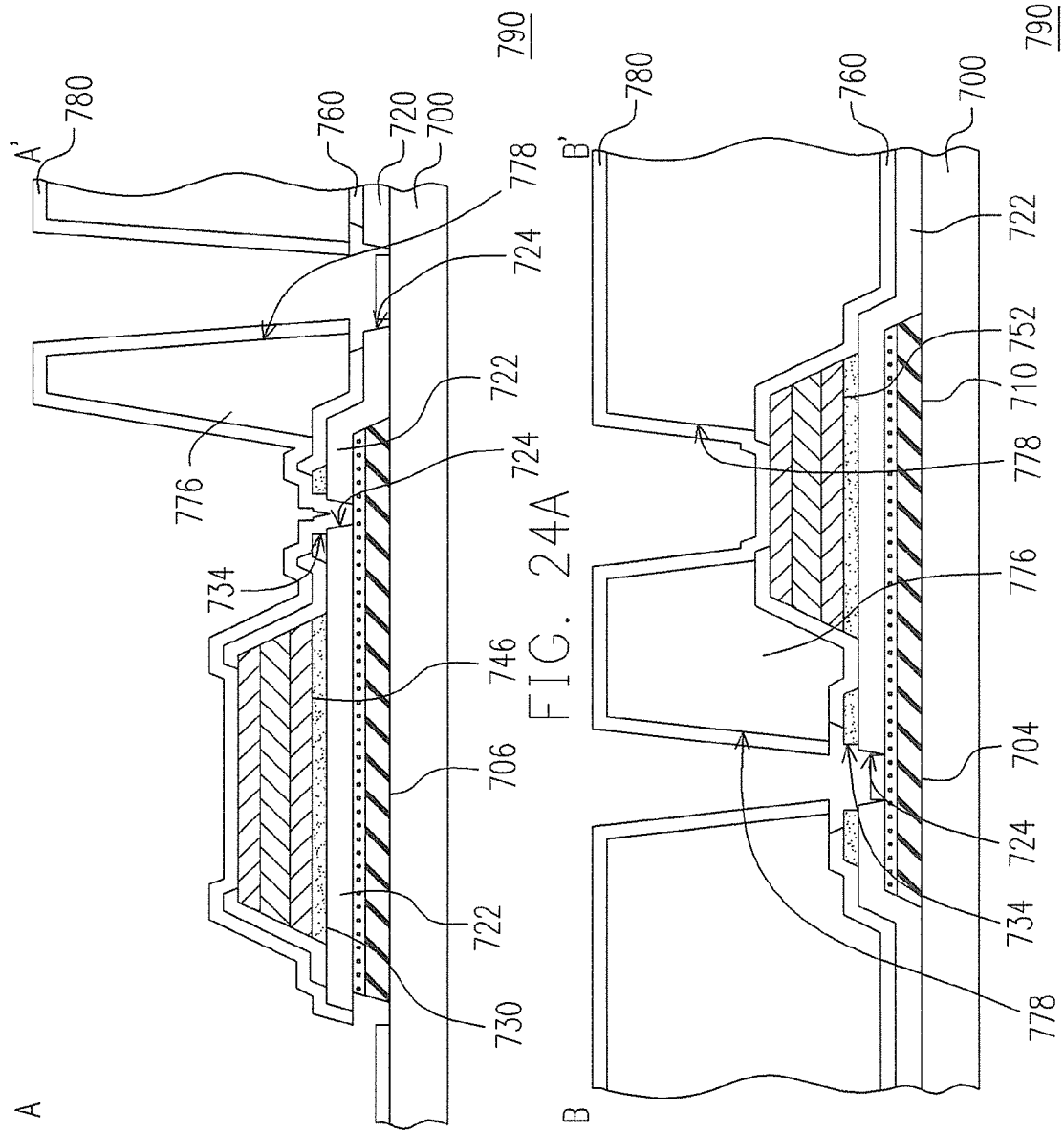

ns can preclude a large parasitic capacitor from being generated between the pixel electrode 170 and the data line 140 to affect the characteristics of the liquid crystal display panel. Hence, with the presence of the patterned overcoat layer 160, the pixel electrode 170 can cover a portion of the upper part of the data line 140 to increase the display aperture ratio.

Using the above five photomasking processes can effectively raise the display aperture ratio of the liquid crystal display panel, and control the planarization of the active matrix array structure 100. However, with the application of five photomasks, the costing down of the manufacturing process becomes difficult. Hence, in order to be cost effective, it is important to decrease the number of photomasks being used.

ACTIVE MATRIX ARRAY STRUCTURE

CROSS-REFERENCE TO RELATED APPLICATION

This application is a divisional application of and claims the benefit of an application Ser. No. 12/102,027, filed on Apr. 14, 2008, now allowed, which claims the priority benefit of Taiwan application serial no. 97100663, filed on Jan. 8, 2008. The entirety of each of the above-mentioned patent applications is hereby incorporated by reference herein and made a part of specification.

BACKGROUND OF THE INVENTION

1. Field of Invention

The invention relates to an active matrix array structure. More particularly, the invention relates to an active matrix array structure with an overcoat layer.

2. Description of Related Art

A thin film transistor liquid crystal display panel (TFT LCD panel) is constructed with an active matrix array structure, a color filter array structure and a liquid crystal layer. The active matrix array structure is configured with a plurality of arrays in rows and columns of active devices, i.e. the thin film transistors (TFT), and a pixel electrode corresponding to each thin film transistor. Each of the above thin film transistors includes a gate, a channel, a drain and a source, and each thin film transistor serves as a switch device of the liquid crystal display panel.

FIG. 1 is a top view of a conventional active matrix array structure having an overcoat layer. FIGS. 2A to 2E are schematic cross-sectional views of FIG. 1 along the cutting lines I-I' in which selected manufacturing process steps of the conventional active matrix array structure are illustrated. Referring to FIGS. 1 and 2A, according to a conventional manufacturing process for an active matrix array structure, a first photomasking process is performed to form a gate 112 and a scan line 120 connected to the gate 112 on the substrate 50. A scan contact pad 122 is concurrently formed at the end of the scan line 120. Thereafter, a gate insulating layer 130 is formed on the substrate 50.

As shown in FIG. 1 and FIG. 2B, a second photomasking process is performed to form a channel region 114 on the gate insulating layer 130 above the gate 112. Continuing to FIGS. 1 and 2C, a third photomasking process is performed to form a source electrode 116, a drain electrode 118 and a data line 140 that connects to the source electrode 116. Another data contact pad 142 is concurrently formed at the end of the data line 140. The substrate 50 is then covered by a passivation layer 150.

Referring to FIGS. 1 and 2D, a fourth photomasking process is conducted to form a patterned overcoat layer 160 on the passivation layer 150. Furthermore, the drain electrode 118 and the passivation layer 150 above the contact pads 122, 142 are exposed. The patterned overcoat layer 160 serves as an etching mask for removing the gate insulating layer 130 and the passivation layer 150 above the contact pads 122, 142, and the passivation layer 150 above the drain electrode 118.

Ultimately, as shown in FIGS. 1 and 2E, a fifth photomasking process is performed to form a pixel electrode 170 on the patterned overcoat layer 160, and a patterned transparent conductive layer 172 on the surfaces of the contact pads 122, 142. In accordance to the above fabrication process, forming a patterned overcoat layer 160 on the passivation layer 150 raises the display aperture ratio of the liquid crystal display panel. The patterned overcoat layer 160 with a greater thick-

SUMMARY OF THE INVENTION

In view of the foregoing, the invention provides an active matrix array structure, which is applicable in a liquid crystal display panel to increase the display aperture ratio of the liquid crystal display panel.

The invention also provides a method for fabricating an active matrix array structure, in which the manufacturing cost required in fabricating an active matrix array structure is reduced.

The invention provides an active matrix array structure, which is disposed on a substrate. The active matrix array structure includes a first patterned conductive layer, a patterned gate insulating layer, a patterned semiconductor layer, a second patterned conductive layer, a patterned overcoat layer, and a transparent conductive layer. The first patterned conductive layer includes a plurality of scan lines, and a plurality of gates and a plurality of scan pads that are connected with the scan lines. The patterned gate insulating layer has a plurality of first openings to expose a portion of the first patterned conductive layer. The patterned semiconductor layer is disposed on the patterned gate insulating layer. The second patterned conductive layer is directly disposed on the patterned semiconductor layer. The second patterned conductive layer includes a plurality of data lines, a plurality of drain electrodes, and a plurality of source electrodes and a plurality of data contact pads that are connected with the data lines. The data lines intersect with the scan lines, and the drain electrodes and the source electrodes are configured above the gates. The patterned overcoat layer has a plurality of second openings. Above the first openings, the second openings expose a portion of the first patterned conductive layer exposed by the first openings, and a portion of the second openings expose a portion of the second patterned conductive layer. The transparent conductive layer is globally disposed on the substrate, wherein a portion of the transparent conductive disposed in the first openings and the second openings is broken off at a position between the substrate and the patterned overcoat layer.

In one embodiment of the invention, the above-mentioned first patterned conductive layer includes a stacked layer of a first aluminum metal layer and a first titanium metal layer, and the second patterned conductive layer includes a stacked layer of a second aluminum metal layer and a second titanium metal layer. The first titanium metal layer is configured between the first aluminum metal layer and the substrate, for example. Moreover, the first aluminum metal layer exposed by the first openings has a recessed sidewall to break off the conductive layer. In other words, the second titanium metal layer is configured between the second aluminum metal layer and the patterned semiconductor layer. A portion of the second openings exposes portions of the data contact pads and data lines, and the second aluminum metal layer in the exposed data contact pads and data lines respectively have a recessed sidewall to break off the conductive layer.

In one embodiment of the invention, the above-mentioned first patterned conductive layer includes a stacked layer of a first aluminum metal layer and a first molybdenum metal layer, and the second patterned conductive layer includes a first titanium metal layer, a second aluminum metal layer and a second titanium metal layer sequentially stacked together. The first patterned conductive layer further includes a second molybdenum metal layer, and the first aluminum metal layer is positioned between the first molybdenum metal layer and the second molybdenum metal layer.

In one embodiment of the invention, the above-mentioned active matrix array structure further includes a patterned passivation layer, and the patterned overcoat layer is configured between the patterned passivation layer and the transparent conductive layer. Moreover, the second openings expose the data contact pads, and in between the data contact pads and the patterned overcoat layer, the patterned passivation layer has a recessed sidewall. When the patterned overcoat layer, the patterned passivation layer and the patterned gate insulating layer are tightly stacked together, the patterned passivation layer has a recessed sidewall at the junctions of the first openings and the second openings. Moreover, a portion of the second openings exposes the drain electrodes, and the patterned passivation layer has a recessed sidewall near the corresponding gates. A portion of the second openings exposes the data lines, and between the data lines and the patterned overcoat layer, the patterned passivation layer has a recessed sidewall. A portion of the patterned semiconductor layer is disposed between the patterned passivation layer and the patterned gate insulating layer, and locates above the scan contact pads and the scan lines. A portion of the first openings exposes the scan lines and the scan pads. Above the scan lines, the patterned passivation layer has a recessed sidewall in between the patterned semiconductor layer and the patterned overcoat layer. The second patterned conductive layer further includes a plurality of auxiliary scan contact pads, disposed above the scan contact pads, and the transparent conductive layer electrically connects the auxiliary pads respectively with the corresponding scan contact pads through the first openings between the patterned semiconductor layer and the scan contact pads.

In one embodiment of the invention, the above-mentioned first opening exposes the borders of the scan contact pads, and the first patterned conductive layer has a recessed sidewall near the borders of the scan contact pads.

In one embodiment of the invention, a portion of the above-mentioned first patterned conductive layer further includes a plurality of auxiliary pads positioned between the data contact pads and the substrate, and the auxiliary pads respectively have a recessed sidewall.

In one embodiment of the invention, at the intersection between each data line and each scan line, the second aluminum layer and the patterned semiconductor layer respectively have a recessed sidewall.

In one embodiment of the invention, at the intersection between each data line and each scan line, the patterned gate insulating layer has a recessed sidewall.

In one embodiment of the invention, the above first patterned conductive layer further includes a plurality of capacitor electrodes extending from the scan lines to between the drain electrodes and the substrate.

In one embodiment of the invention, the above-mentioned second patterned conductive layer further includes a plurality of capacitor electrode. The scan lines are configured between the capacitor electrodes and the substrate, and the capacitor electrodes and the drain electrodes are electrically connected.

The invention applies three photomasking processes to fabricate an active matrix array structure having an overcoat layer. Hence, the fabrication cost is greatly reduced due to a reduction of the number of photomasks being used. Moreover, in the active matrix array structure of the invention, the disposition of the overcoat layer mitigates the parasitic capacitor between the pixel electrodes and the data lines. Accordingly, the transparent conductive layer is partially overlapped with the data lines to increase the display aperture ratio of the active matrix array structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 6A to 6D are cross-sectional views of FIG. 5 along the cutting lines AA', BB', CC' and DD' according to the first embodiment of the invention.

FIGS. 8A to 8D are cross-sectional views showing the first etching process in the third photomasking process of the active matrix array structure according to the first embodiment of the invention.

FIGS. 9A to 9D are cross-sectional views showing the second etching process in the third photomasking process of the active matrix array structure according to the first embodiment of the invention.

FIGS. 10A to 10D are cross-sectional views showing the oxygen (plasma) ashing process in the third photomasking process of the active matrix array structure according to the first embodiment of the invention.

FIGS. 15A to 15D are cross-sectional views of FIG. 14 along the cutting lines AA', BB', CC' and DD'.

FIGS. 17A to 17D are schematic cross-sectional views of FIG. 16 along the cutting lines AA', BB', CC and DD'.

FIGS. 19A to 19D are schematic diagram of FIG. 18 along the cutting lines AA', BB', CC' and DD'.

FIGS. 20A to 20D are schematic, cross-sectional views of a first dry etching process in the third photomasking process according to the third embodiment of the invention.

FIGS. 21A to 21D are schematic, cross-sectional views of a wet etching process in the third photomasking process according to the third embodiment of the invention.

FIGS. 22A to 22D are schematic, cross-sectional views of a second dry etching process in the third photomasking process according to the third embodiment of the invention.

FIGS. 23A to 23D are schematic, cross-sectional views of an oxygen (plasma) ashing process in the third photomasking process according to the third embodiment of the invention.

FIGS. 24A to 24D are schematic, cross-sectional views of the active matrix array structure according to the third embodiment of the invention.

DESCRIPTION OF EMBODIMENTS

First Embodiment

Figure 1:
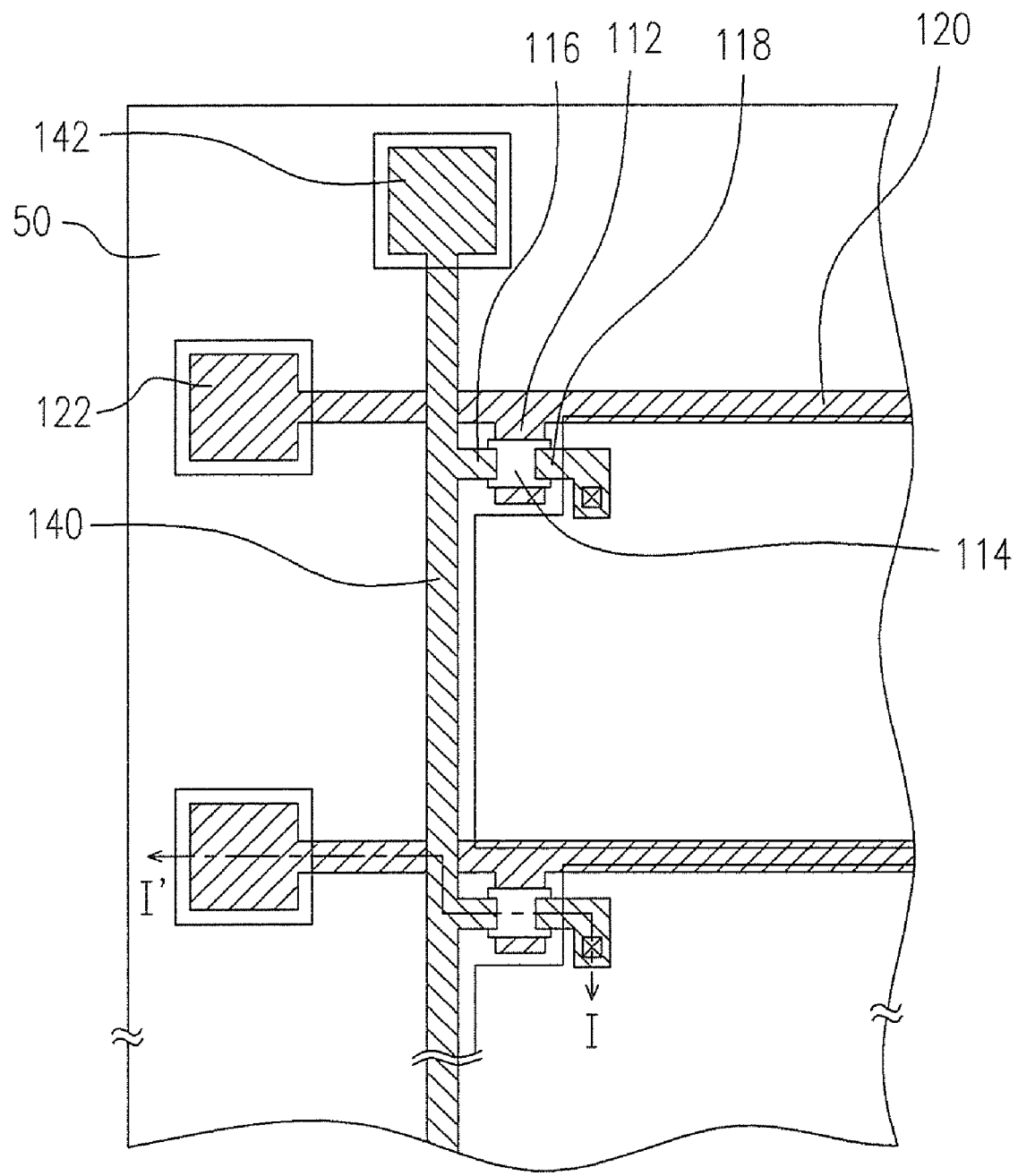
FIG. 1 is a schematic top view of an active matrix array substrate according to the prior art.
Figure 2A:
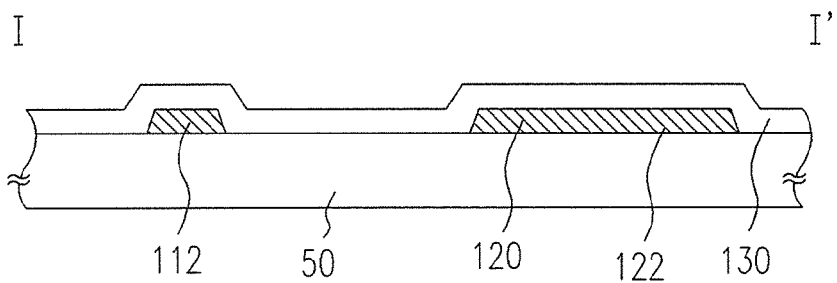
FIGS. 2A to 2E are cross-sectional views of FIG. 1 along the cutting lines I-I' showing selected fabrication process steps.
Figure 2B:
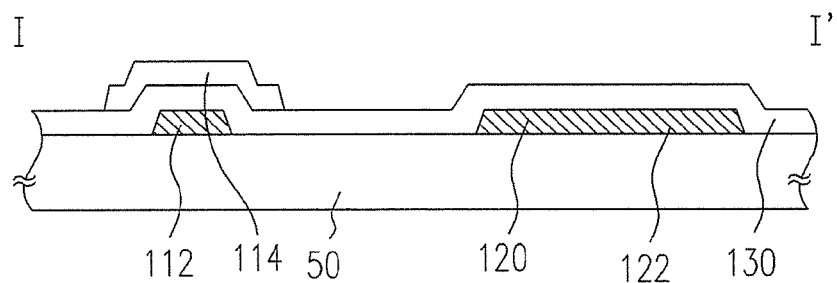
Figure 2C:
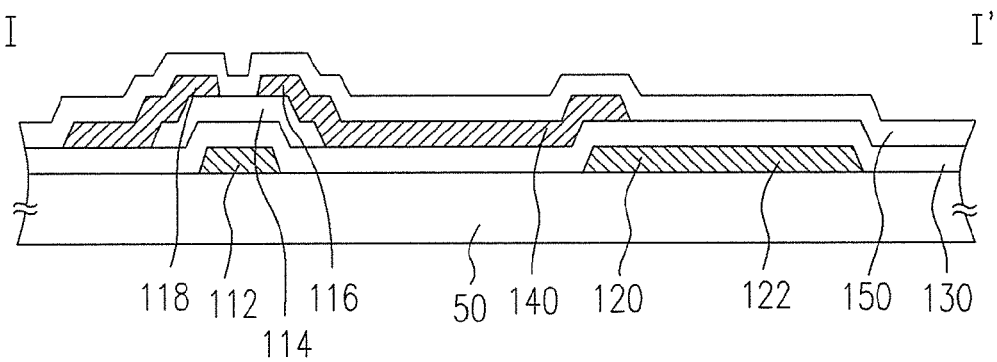
Figure 2D:
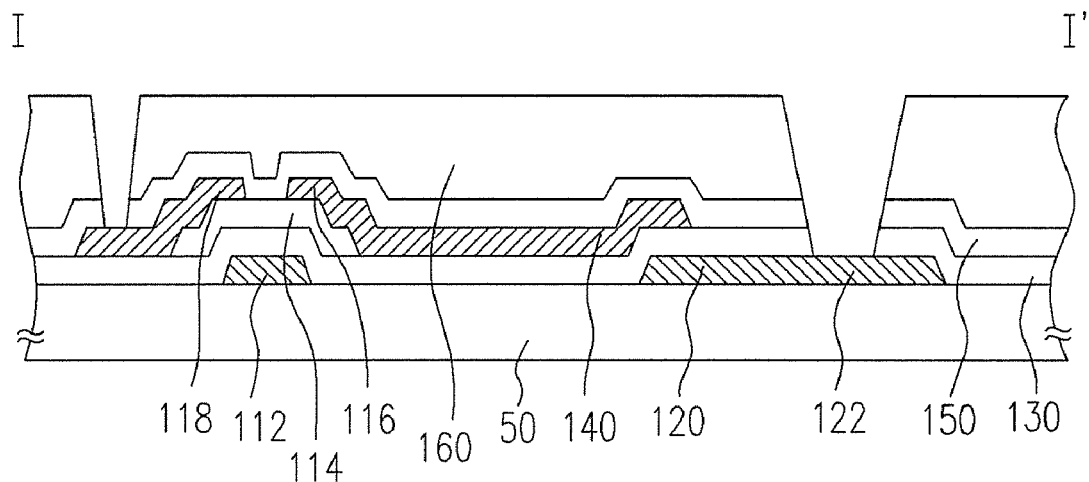
Figure 2E:
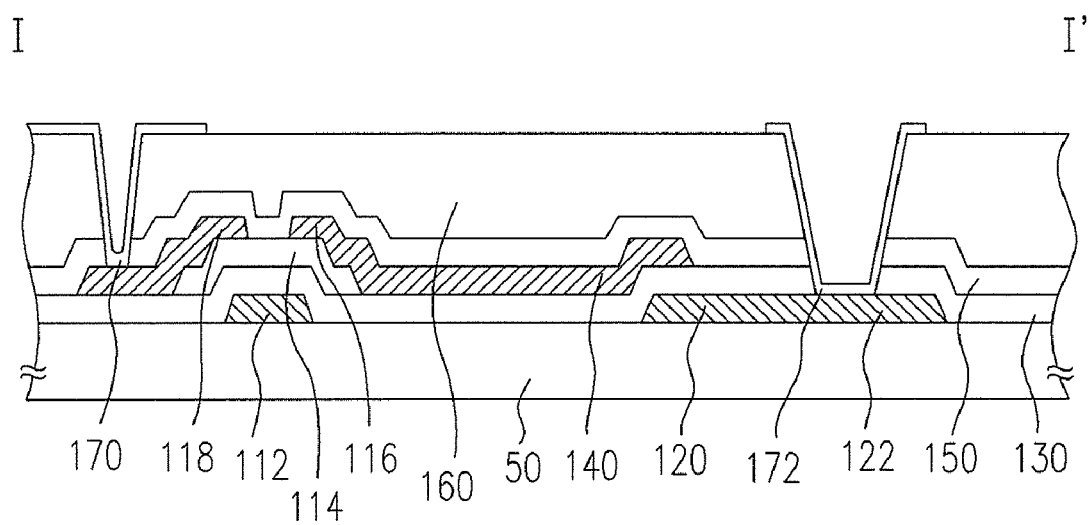
Figure 3:
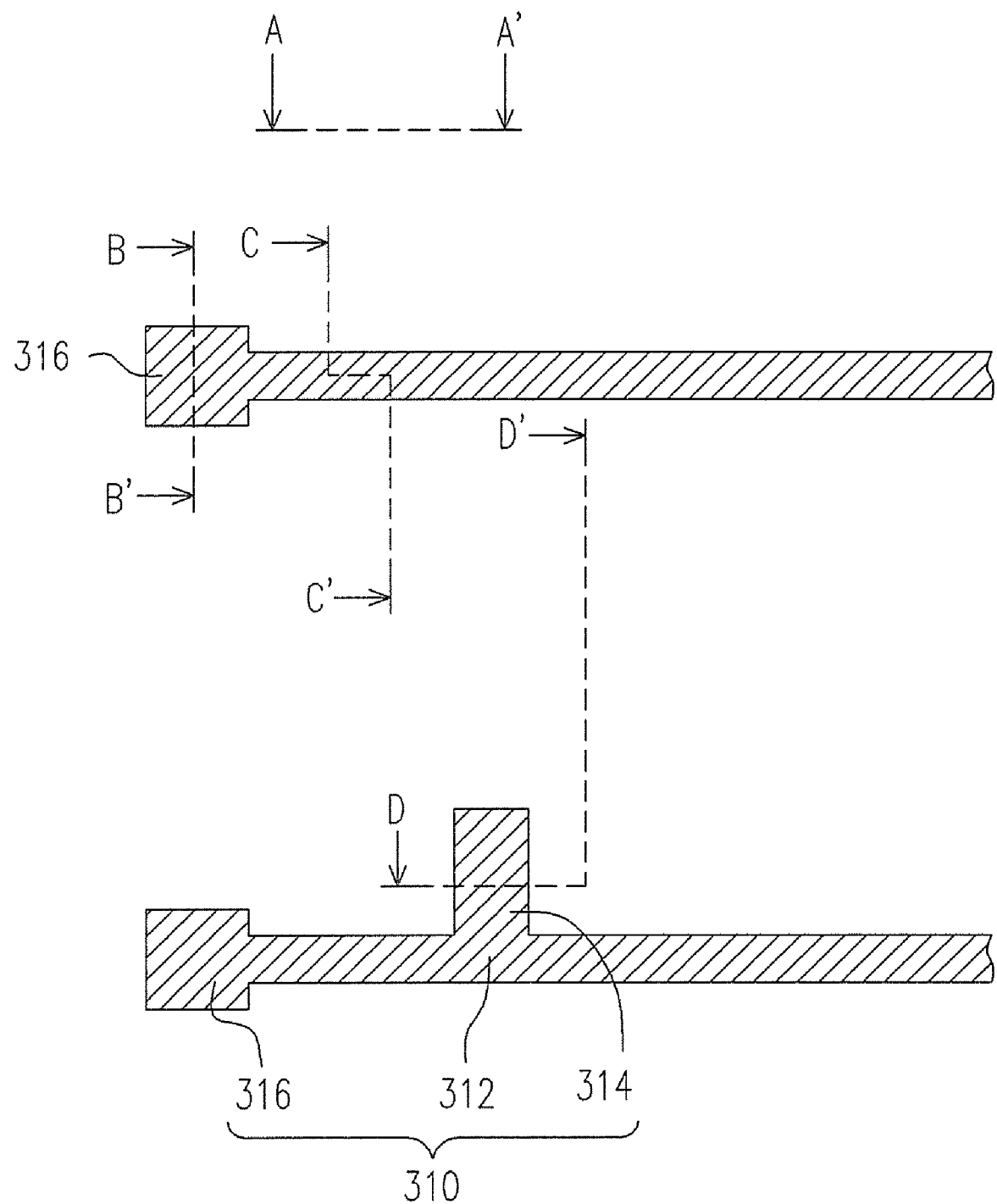
FIG. 3 is a top view of the first photomasking process of the active matrix array structure according to a first embodiment of the invention.
Figure 4A:
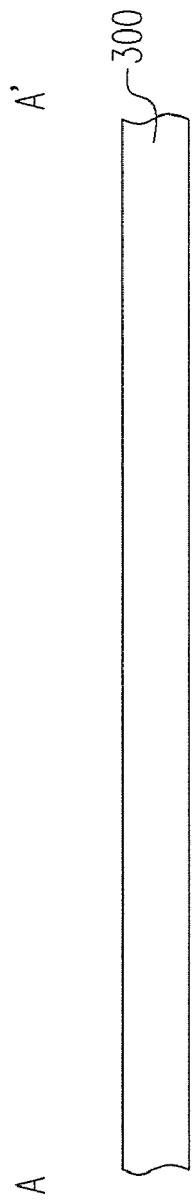
FIGS. 4A to 4D are cross-sectional views of FIG. 3 along the cutting lines AA', BB', CC' and DD' respectively.
Figure 4B:
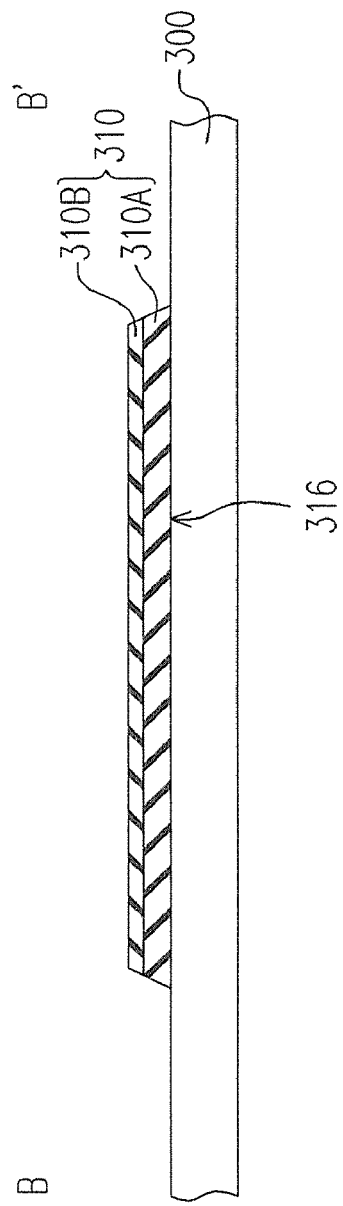
Figure 4C:
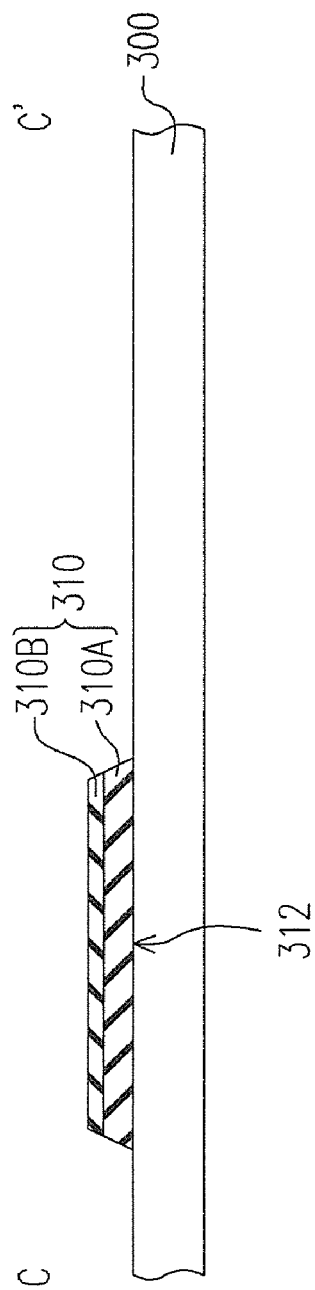
Figure 4D:
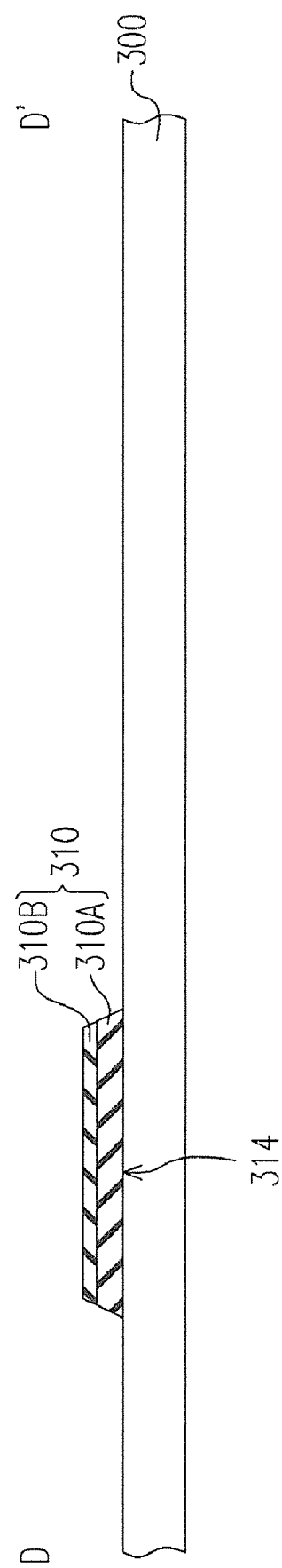

FIG. 3 is a top view showing the first photomasking process of the active matrix array structure according to a first embodiment of the invention. FIGS. 4A to 4D are cross sectional views of FIG. 3 along the cutting lines AA', BB' CC' and DD', respectively. Referring to FIGS. 3 and 4A to 4D, the fabrication of an active matrix array structure of this embodiment of the invention includes forming a first conductive layer (not shown) on a substrate 300, and patterning the first conductive layer (not shown) by performing a first photomasking process to form a first patterned conductive layer 310. The first patterned conductive layer 310 includes a plurality of scan lines 312, a plurality of gates 314 and a plurality of scan contact pads 316, and the scan lines 312 are connected with the gates 314 and the scan contact pads 316.

In this embodiment, the first patterned conductive layer 310 includes, for example, a multi-layer of metal stacked layer structure constructed with a first titanium metal layer 310A and a first aluminum metal layer 310B. The first titanium metal layer 310A is configured between the first aluminum metal layer 310B and the substrate 300. In other embodiments, the first patterned conductive layer 310 may include a multi-layer of metal stacked layer structure constructed with other metal layers. For example, aluminum or aluminum alloy may be selected as a material of the upper metal layer. Moreover, the photomask applied in the first photomasking process of the embodiment of the invention is a normal photomask, for example, and the first photomasking process includes a lithography process and an etching process. More particularly, the first photomasking process includes coating a photoresist layer (not shown) on the first conductive layer (not shown), followed by patterning the photoresist layer with the lithograph process, and using the patterned photoresist layer (not shown) as a mask to perform the etching process to remove the unwanted first conductive layer (not shown) to obtain the first patterned conductive layer 310. The first photomasking process is completed after the patterned photoresist layer (not shown) above the first patterned conductive layer 310 is removed.

Figure 5:
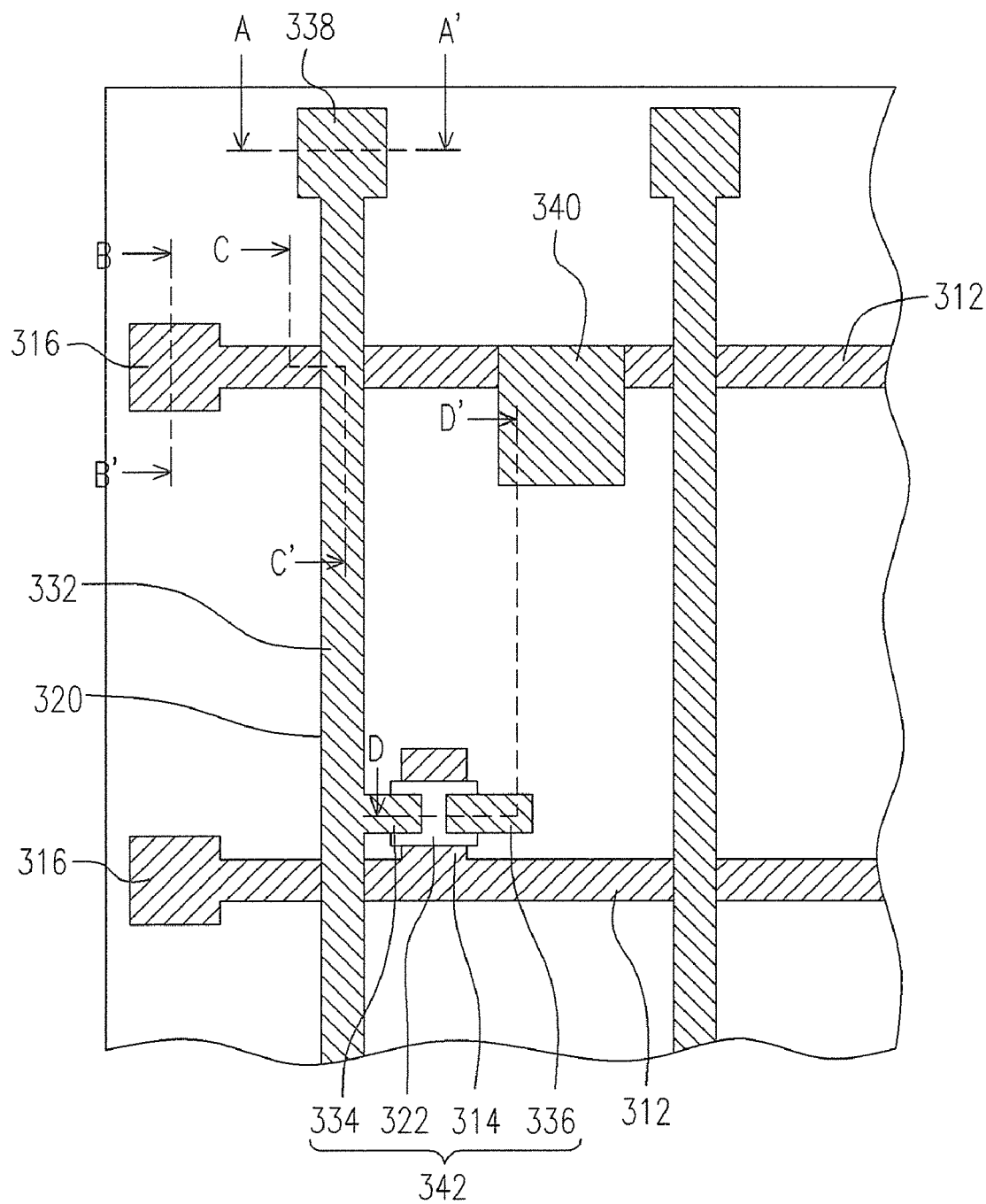
FIG. 5 is a top view of the second photomasking process of the active matrix array structure according to the first embodiment of the invention.

FIG. 5 is a top view of the second photomasking process of the active matrix e array structure of the first embodiment of the invention, and FIGS. 6A to 6D are cross sectional views of FIG. 5 along the cutting lines AA', BB' CC' and DD", respectively. Referring to FIG. 5 and FIGS. 6A to 6D, a gate insulating layer 318, a semiconductor layer (not shown) and a second conductive layer (not shown) are sequentially formed on the substrate 300. A second photomasking process is performed to form a patterned semiconductor layer 320 and a second patterned conductive layer 330 configured above the patterned semiconductor layer 320. The second patterned conductive layer 330 includes a plurality of data lines 332, a plurality of source electrodes 334, a plurality of drain electrodes 336, a plurality of data contact pads 338 and a plurality of capacitor upper electrodes 340. The data lines 332 and the scan lines 312 intersect with each other. Each of the capacitor upper electrodes 340 positioned above each scan line 312 overlaps with a portion of the scan line 312 to form a storage capacitor structure. Moreover, each data line 332 is connected to one of the source electrodes 334 and one of the data contact pads 338, and each drain electrode 336 and the corresponding source electrode 334 configured above one of the gates 314 form a thin film transistor 342.

The second patterned conductive layer 330 includes, for example, a multi-layered structure constructed with a second titanium metal layer 330A and a second aluminum metal layer 330B, and the second titanium metal layer 330A is configured between the second aluminum metal layer 330B and the patterned semiconductor layer 320. The second patterned conductive layer 330 may also be a multi-layered metal structure constructed with other metal layers. It is worthy to note that, in this embodiment, the second patterned conductive layer 330 and the patterned semiconductor layer 320 are formed by continuous deposition and patterning. Accordingly, the patterned semiconductor layer 320 is configured between the second patterned conductive layer 330 and the gate insulating layer 318. In other words, the second patterned conductive layer 330 is not disposed directly above the gate insulating layer 318. Moreover, an ohmic contact layer (not shown) may be disposed between the second patterned conductive layer 330 and the patterned semiconductor layer 320.

Figure 7:
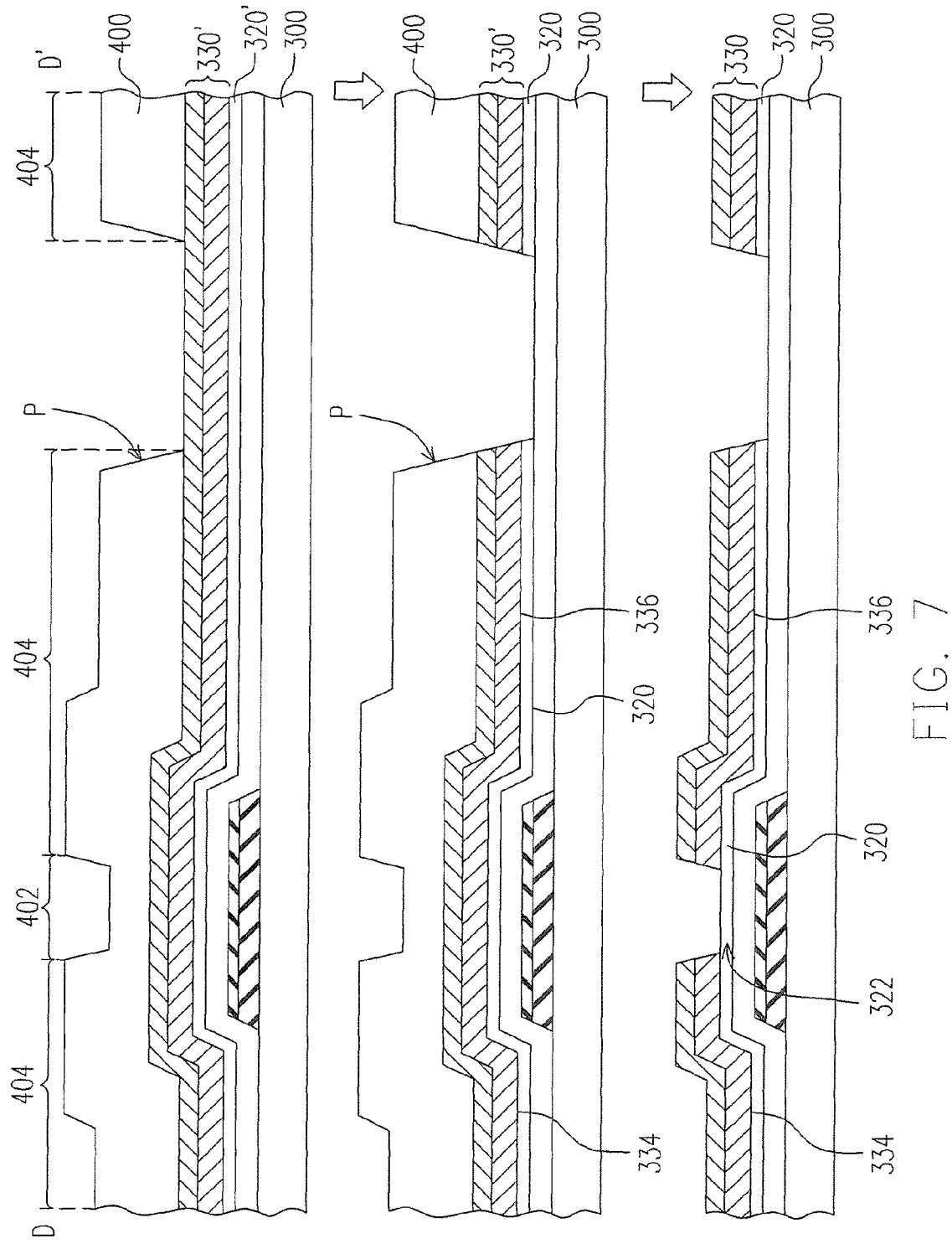
FIG. 7 is a cross-sectional view of FIG. 5 along the cutting lines DD', showing the fabrication of the second photomasking process.

In order for the thin film transistor 342 to maintain a normal operation, a part of the metal material and the ohm contact layer above the gate 314 must be removed to expose a portion of the semiconductor layer 320 as a channel region 322 (as shown in FIG. 6D). Accordingly, a half tone photomask is used in the second photomasking process to achieve the etching of different depths. More particularly, FIG. 7 is a cross-sectional view of the second photomasking process in FIG. 5 along the cutting line DD'. Referring to FIG. 7, a semiconductor layer 320', a second conductive layer 330' and a patterned photoresist layer 400 are sequentially formed on the substrate 300. The patterned photoresist layer 400 includes a first thickness region 402 and a second thickness region 404. Moreover, the patterned photoresist layer 400 includes a plurality of openings P for exposing a portion of the second conductive layer 330'.

Thereafter, an etching process is performed to remove a portion of the second conductive layer 330' and a portion of the semiconductor layer 320' that are not covered by the patterned photoresist layer 400. In other words, the portion of the second conductive layer 330' and the portion of the semiconductor layer 320' under the opening P are removed to form a patterned semiconductor layer 320. As shown in FIG. 5, a majority of the second conductive layer 330' in the region enclosed by the scan line 312 and the data line 332 is removed, leaving behind the source electrode 334, the drain electrode 336 and the capacitor electrode 340.

Thereafter, the patterned photoresist layer 400 is completely removed. A portion of the second conductive layer 330' in the first thickness region 402 and above the patterned semiconductor layer 320 is concurrently removed to form a second patterned conductive layer 330. The second photomasking process relies on the application of a patterned photoresist having various thicknesses as a covering mask and the time for fully removing the photoresist in the second thickness region 404 as an etching stop for removing the patterned photoresist layer 400. Hence, the portion of the second conductive layer 330' in the first thickness region 402 can be completely removed to expose the channel region 322. In accordance to the invention, a single photomask used in achieving various etch depths helps to decrease the number of photomasks required and reduce the manufacturing cost of an active matrix array structure.

Figure 8C:
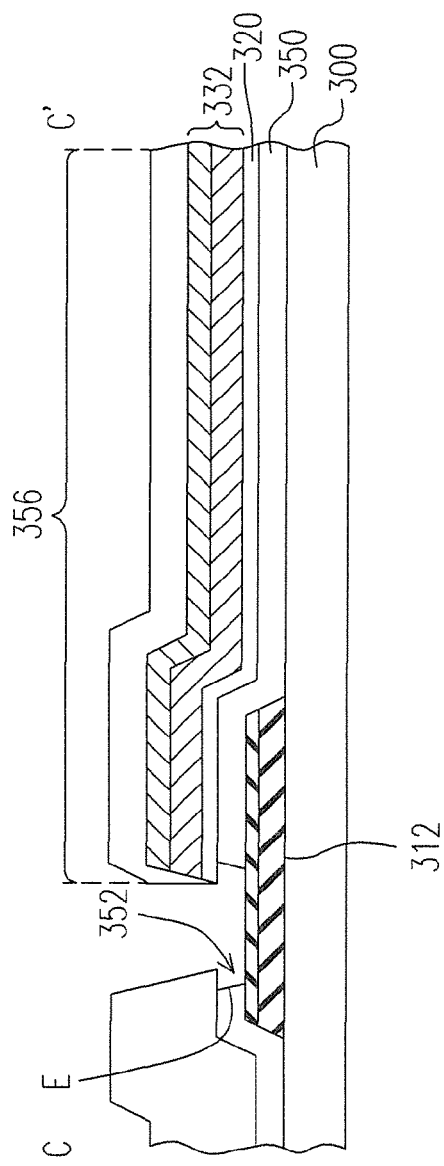
Figure 8D:
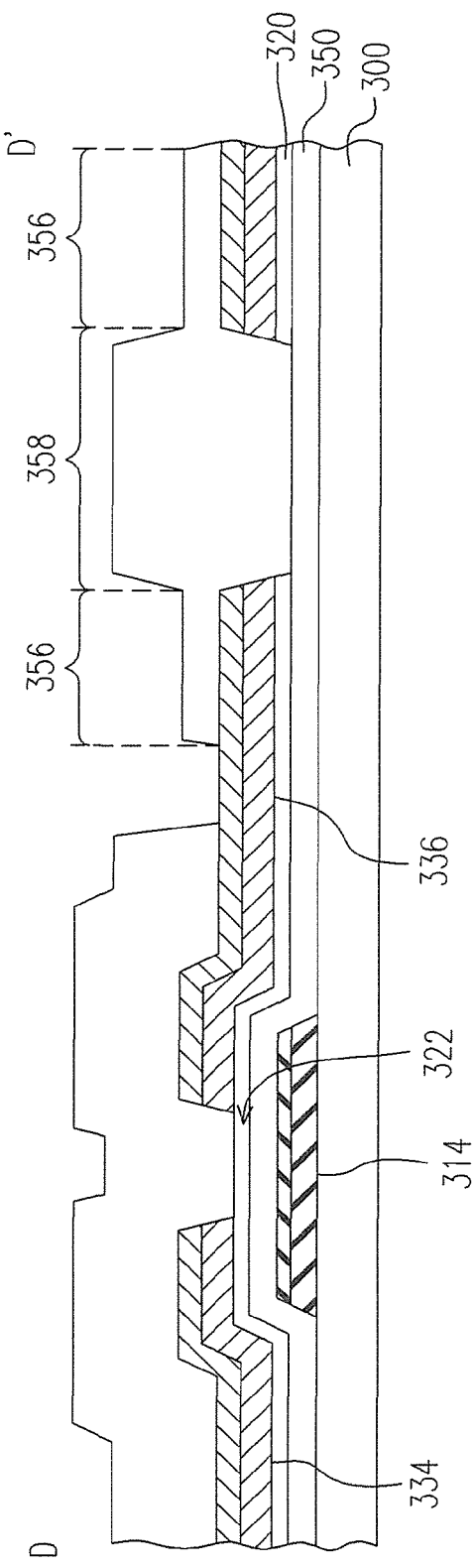

FIGS. 8A to 8D are cross-sectional views showing a first etching process in the second photomasking process of the active matrix array structure according to the first embodiment of the invention. Referring to FIGS. 8A to 8D, an overcoat material layer (not shown) is formed on the substrate 300, and the overcoat material layer is further patterned to form a pre-patterned overcoat layer 354. The pre-patterned overcoat layer 354 includes a first thickness region 356 and a second thickness region 358. The first thickness region 356 is disposed above the data line 332 and the drain electrode 336, above the surface of a part of a region away from the gate 314, as shown in FIG. 8C. In the embodiment of the invention, the material of the pre-patterned overcoat layer 354 includes, but not limited to, a photosensitive dielectric material. In this process step, a half tone mask is used in a photolithograph process to form a pre-patterned overcoat layer 354 with various thicknesses. In other embodiments, the photomask used in forming the pre-patterned overcoat layer 354 may be a grey scale photomask or a photomask that can provide various transparencies in different regions.

Then, a first etching process is performed to remove the portion of the gate insulating layer 318 that is not covered by the pre-patterned overcoat layer 354 to form a patterned gate insulating layer 350 having a plurality of first openings 352. The sidewall of patterned gate insulating layer 350, which is in the first opening 352, is a receded structure, in which the sidewall of the patterned gate insulating 350 is depressed or recessed when it is compared to the sidewall of the layer above, which may be the pre-patterned overcoat layer 354 or the patterned semiconductor layer 320. Further, a portion of the first patterned conductive layer 310 is exposed by the first opening 352. In this embodiment, a plurality of first openings 352 is formed in the patterned gate insulating layer 350 during the first etching process, and each first opening 352 exposes portions of the scan contact pads 316 and the scan lines 312. Moreover, the pre-patterned overcoat layer 354 further exposes portions of the data contact pads 338 and drain electrodes 336.

FIGS. 9A to 9D are cross-sectional views showing selected process steps for a second etching process in the third photomasking process of the active matrix array structure according to the first embodiment of the invention. Referring to FIGS. 9A to 9D, a second etching process is performed. The uncovered part of the patterned conductive layer 310 and the uncovered part of the second patterned conductive layer 330 are respectively formed with a recessed sidewall E. The second etching process, for example, a select isotropic etching process, is performed to form a recessed sidewall E respectively on the uncovered part of the first patterned conductive layer 310 and the uncovered part of the second patterned conductive layer 330. In other words, the sidewall of the first patterned conductive layer 310 and the sidewall of the second patterned conductive layer 330 are depressed or recessed with respect to the layers above, for example, the pre-patterned overcoat layer 354 and the patterned gate insulating layer 350, respectively. Since the upper metal layer of the first patterned conductive layer 310 and the second patterned conductive layer 330 are aluminum metal layers, the etchant used in the second etching process includes any solution appropriates for etching an aluminum material. During the second etching process, the first aluminum metal layer 310B and the second aluminum metal layer 330B that are not covered by the pre-patterned overcoat layer 354 are located correspondingly to the data contact pad 338, the scan contact pad 316, the scan line 312 and the drain electrode 336. Hence, the exposed portions of the data contact pad 338, the scan contact pad 316, the scan line 312 and the drain electrode 336 are respectively formed with a recessed sidewall E.

FIGS. 10A to 10D are cross-sectional views showing selected process steps for an oxygen (plasma) ashing process in the third photomasking process of the active matrix array structure according to the first embodiment of the invention. Referring to FIGS. 10A to 10D, a plasma ashing process is performed to remove a portion of the pre-patterned overcoat layer 354 of the first thickness region 356 to form a patterned overcoat layer 360 having second openings 362. Since the first thickness region 356 is configured above a part of the data line 332 and a part of the drain electrode 336, portions of the data line 332 and the drain electrode 336 become exposed in this process step. The second openings 362 of the patterned overcoat layer 360 are configured above parts of the scan contact pad 316, the scan line 312, the data contact pad 338, the data line 332 and the drain electrode 336. Hence, a portion of the second openings 362 at the regions above the scan pad 316 and the scan line 312 is connected with the first openings 352 of the patterned gate insulating layer 350.

Figure 11:
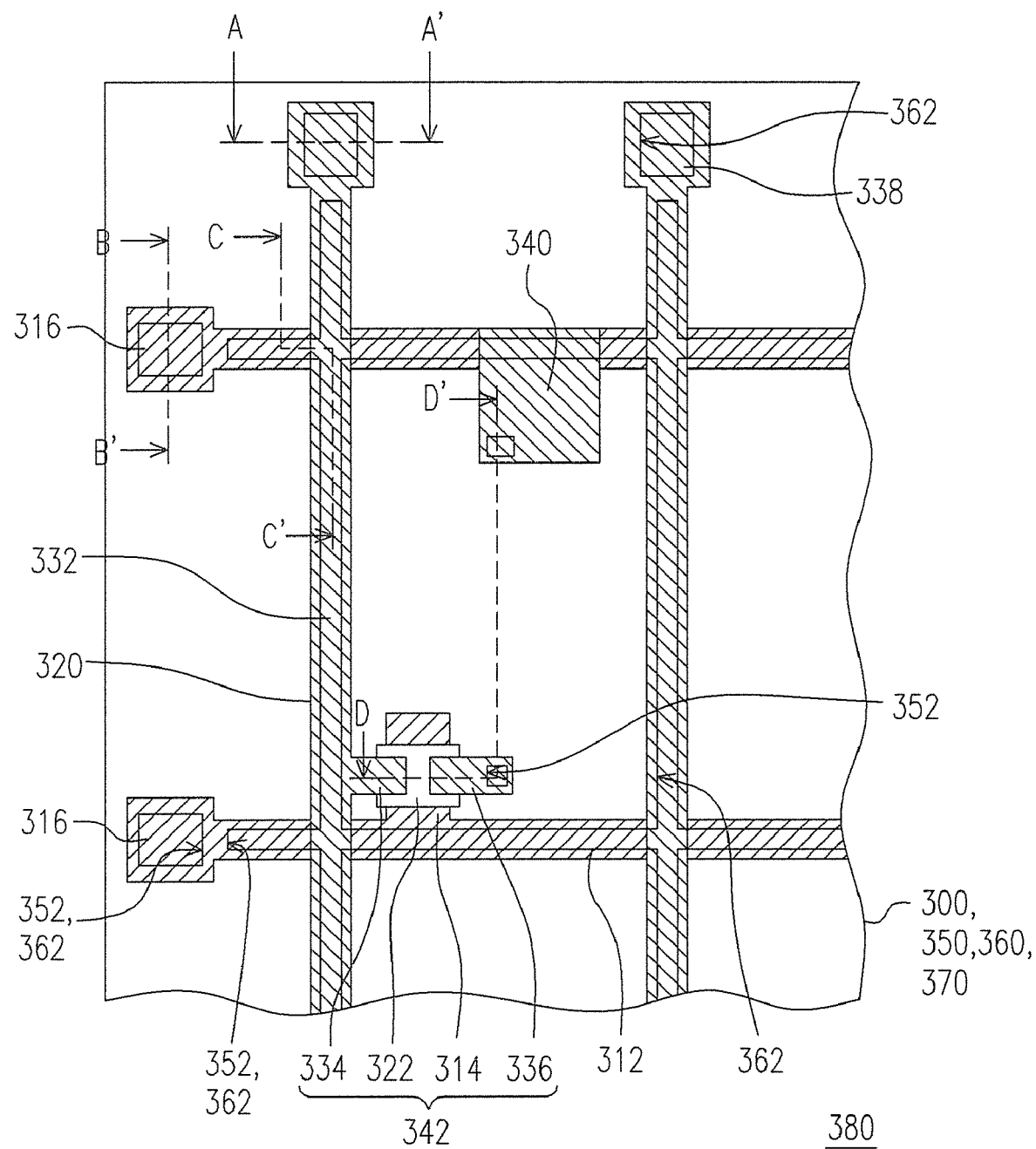
FIG. 11 is a schematic diagram showing the active matrix array structure according to the first embodiment of the invention.

Thereafter, a transparent conductive layer 370 is globally deposited on the substrate 300 to form the active matrix array structure 380 as shown in FIG. 11. The method of forming the transparent conductive layer 370 includes performing chemical vapor deposition or physical vapor deposition. The transparent conductive layer 370 is directly deposited on the patterned overcoat layer 360 and the metal devices exposed by the first opening 352 and the second opening 362.

In order for the active matrix array structure 380 to operate normally, it is essential to maintain an appropriate electrical insulation or electrical connection between the first patterned conductive layer 310 and the second patterned conductive layer 330. Hence in the conventional fabrication process of an active matrix array structure, an additional photomask must be required to pattern the transparent conductive layer 370. Ultimately, the fabrication cost is increased.

In the third photomasking process of this embodiment, by adjusting the process conditions and the process steps, the patterned gate insulating layer 350, the first aluminum metal layer 310B and the second aluminum metal layer 330B in the corresponding first openings 352 and second openings 36 are respectively formed with a recessed sidewall E. Hence, the transparent conductive layer 370 is broken off at the junctions between the first openings 352 and the second openings 362 to maintain appropriate electrical characteristics for each device.

Continuing to FIG. 10A, from the cross-sectional view along the cutting line AA', a part of the data contact pad 338 and a portion of the data line 332 are exposed by a part of the second openings 362. Concurrently, the second aluminum metal layer 330B in the exposed portion of the data contact pad 338 and the data line 332 respectively have a recessed sidewall E for the transparent conductive layer 370 to become discontinued. Accordingly, the data contact pad 338 and the data line 332 will not be electrically connected with other devices to generate a short circuit.

Continuing to FIGS. 10B and 10C, as shown in the cross-sections along the cutting lines BB' and CC', the first aluminum metal layer 310B exposed by the first openings 352 has a recessed sidewall E for the transparent conductive layer 370 to become discontinued. The first opening 352 is positioned above the scan line 312 and the scan pad 316. Hence, a short circuit between the scan line 312 and the scan pad 316 or between the scan lines 312 and other devices can be avoided by the recessed sidewall E of the first aluminum metal layer 310B.

Moreover, as shown in FIG. 10D, which is a cross-section view along the cutting line DD', at the one side, that is away from the corresponding gate 314, of the second aluminum metal layer 330B, the transparent conductive layer 370 extends from the drain electrode 336 to the patterned overcoat layer 360. Accordingly, the transparent conductive layer 370 in the region surrounded by the scan line 312 and the data line 332 can be electrically connected with the drain electrode 336 to serve as a pixel electrode. In this embodiment, an electrical connection may be maintained between the transparent conductive layer 370 in the region that is surrounded by the scan line 312 and the data line 332, and the capacitor upper electrode 340 to form a storage capacitor.

Accordingly, by using the half tone mask in the second photomasking process, an etching process for various depths can be achieved. Hence, the source electrode 334, the drain electrode 336 and the channel region 322 of the thin film transistor 342 can be patterned in a single photomasking process to reduce the manufacturing cost. Moreover, in the third photomasking process, by controlling the etching condition and the application of a half tone mask, the patterned gate insulating layer 350 and aluminum metal layer 310B, 330B are respectively foamed with a recessed sidewall E. Concurrently, an appropriate opening is formed in the third photomasking process for the transparent conductive layer 370 to be electrically connected with the drain electrode 336 and the capacitor upper electrode 340. Hence, in accordance to the embodiment of the invention, the transparent conductive layer 370 needs not rely on other photomasking process to be patterned to complete the fabrication of the active matrix array structure 380. Further, the manufacturing cost is reduced.

Moreover, the thickness of the patterned overcoat layer 360 in the embodiment also benefits to reduce the parasitic capacitance between the data line 332 and the transparent conductive layer 370. As the active matrix array structure 380 is applied to a liquid crystal display panel, the transparent conductive layer 370 serving as a pixel electrode is overlapped with the data line 332, to increase the display aperture ratio of the liquid crystal display panel.

Figure 12:
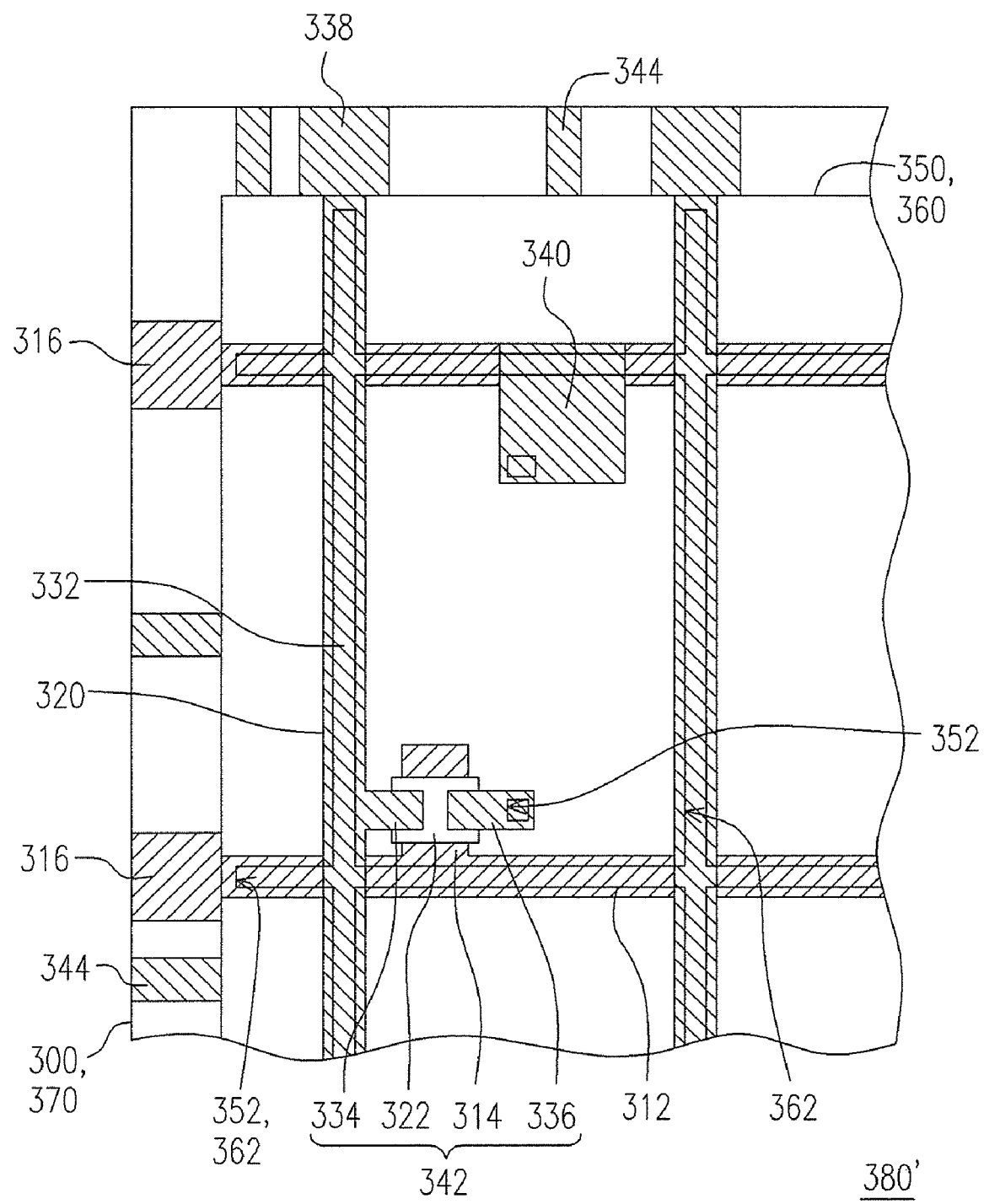
FIG. 12 is a schematic diagram showing another active matrix array structure according to the first embodiment of the invention.

FIG. 12 illustrates another active matrix array structure according to the first embodiment of the invention. Referring to FIG. 12, in the active matrix array structure 380' of this embodiment, the pattern in the third photomask may be adjusted for the patterned overcoat layer to expose the scan contact pads 316 and the data contact pads 338 at the periphery. In the third photomasking process, one side of the patterned overcoat layer 360 or the patterned gate insulating layer 350, which is close to the exposed first aluminum metal layer 310B and the second aluminum metal layer 330B, has a recessed sidewall E Accordingly, during the fabrication of the transparent conductive layer 370, no unwanted electrical connection between the scan contact pad 316 and the data contact pad 338 with the devices covered by the patterned overcoat layer 360 is resulted.

Moreover, electrical insulation must be maintained between each scan contact pad 316 and each data contact pad 338 to avoid generating a short circuit. Accordingly, in this embodiment, an isolation line 344 may be concurrently formed between each contact pad 316, 338 during the fabrication of a second patterned conductive layer 330. The isolation line 344 is disposed above a part of the patterned gate insulating layer 350, and a portion of the patterned semiconductor layer 320 is positioned between the isolation line 344 and the patterned gate insulating layer 350. In the third photomasking process, the patterned gate insulating layer 350 near the isolation line 344 is formed with a recessed sidewall E. Accordingly, with the disposition of the isolation line 344, the transparent conductive layer 370 is broken off at a position that is in between each scan contact pad 316 and each data contact pad 338 to avoid generating a short circuit.

Figure 13:
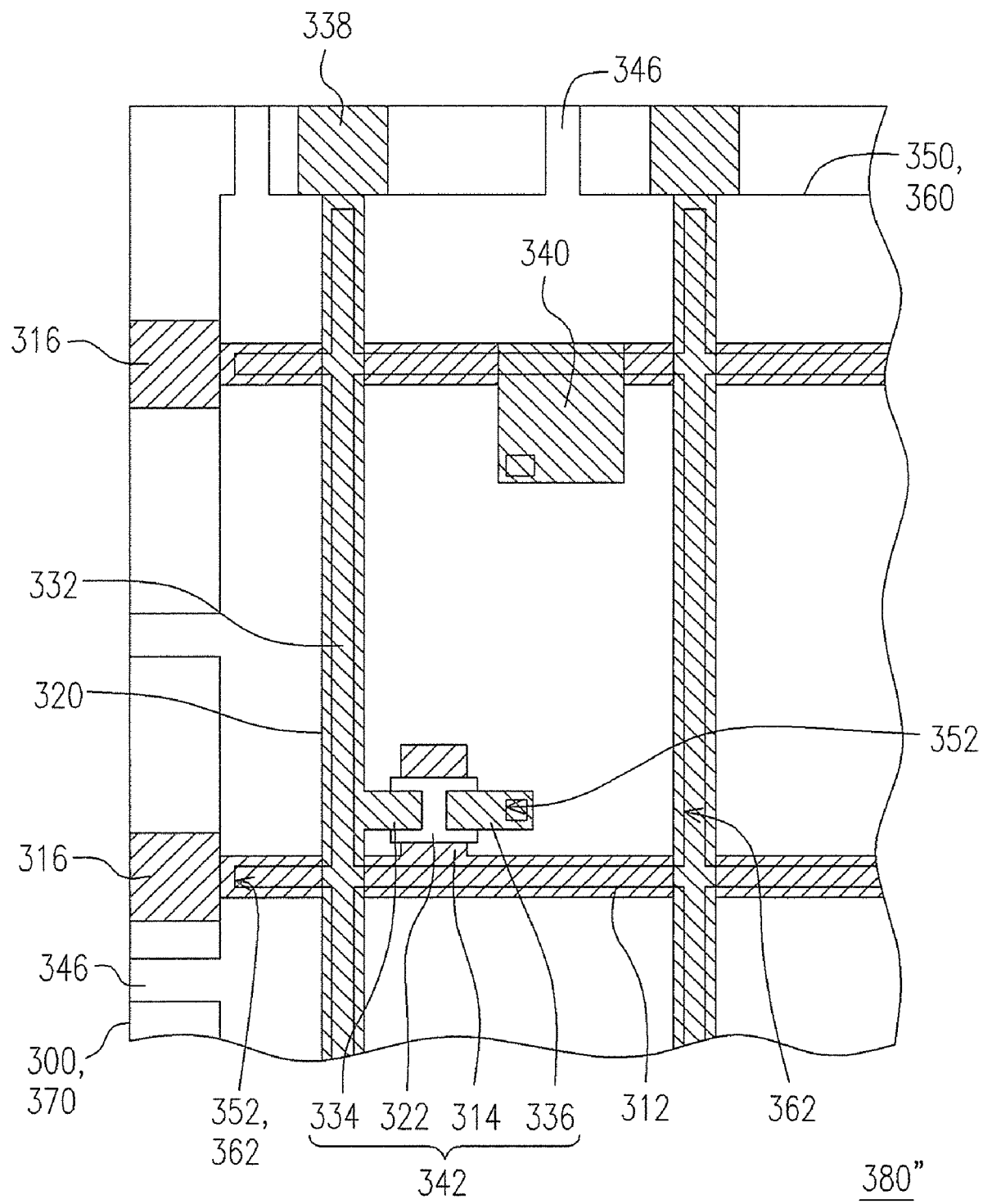
FIG. 13 is a schematic diagram showing yet another active matrix array structure according to the first embodiment of the invention.

FIG. 13 illustrates yet another active matrix array structure according to the first embodiment of the invention. Referring to FIG. 13, the active matrix array structure 380" and the active matrix array structure 380' are substantially similar. The difference between the two structures 380' and 380" is that the patterned overcoat layer 360 of the active matrix array structure 380" has a plurality of branches 346 that extend between each scan contact pad 316 and each data contact pad 360 to electrically insulate each scan contact pad 316 with each data contact pad 338. More particularly, the patterned gate insulating layer 350 near the branches 346 will have a recessed sidewall E. Hence, during the formation of the transparent conductive layer 370, the transparent conductive layer 370 is discontinued near the branches 346 for each pad 316, 338 to be electrically insulated. In the active matrix array structure 380", the second patterned conductive layer 330 does not require an isolation line to be disposed between each contact pad 316, 338.

Second Embodiment

Figure 14:
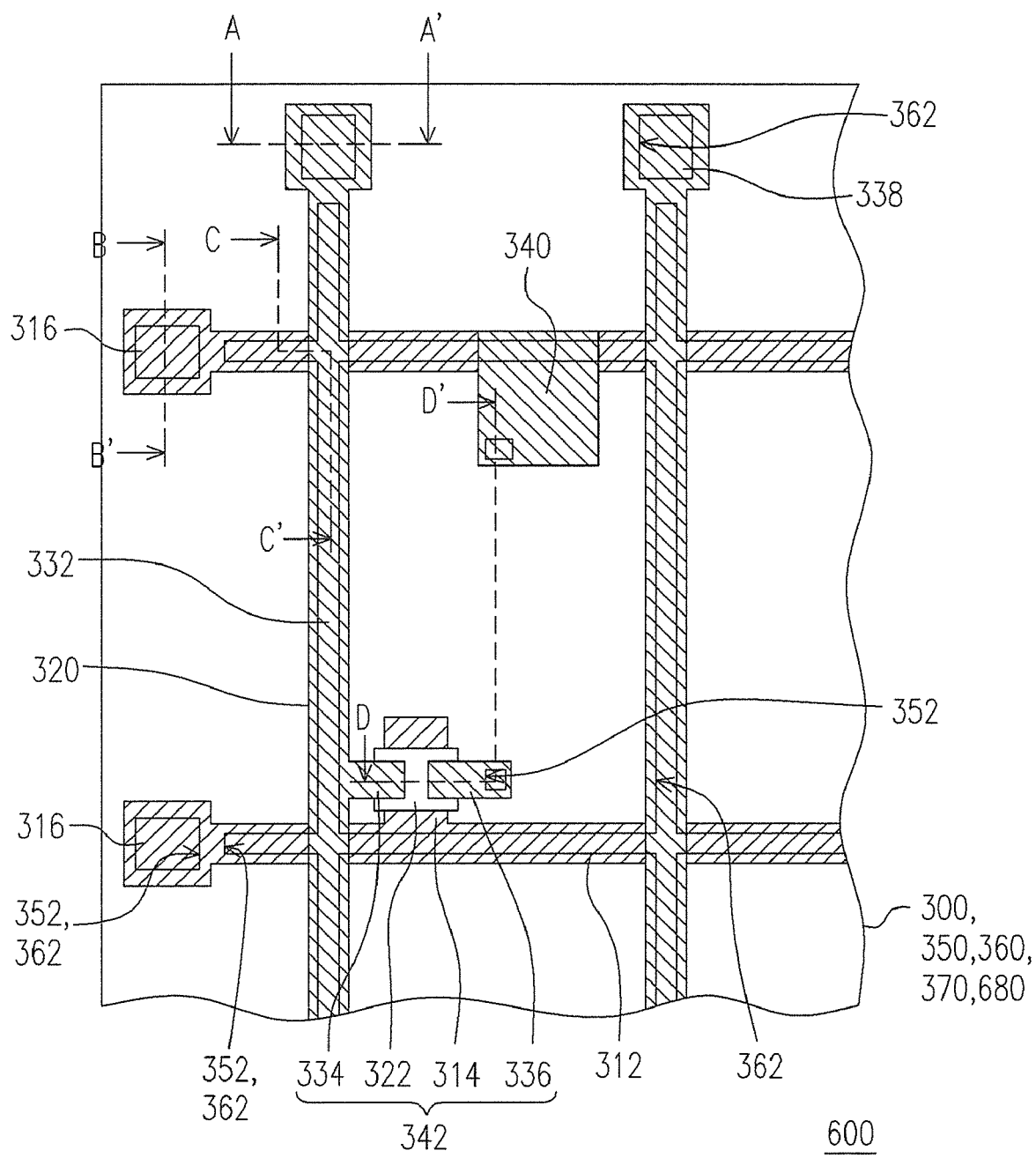
FIG. 14 is a schematic diagram showing an active matrix array structure according to the second embodiment of the invention.

FIG. 14 is a schematic diagram illustrating an active matrix array structure according to a second embodiment of the invention. FIGS. 15A to 15D are cross-sectional views of FIG. 14 along the cutting lines AA', BB' CC' and DD'. Referring to FIGS. 14 and 15A to 15D, the active matrix array structure 600 and the active matrix array structure 380 in the first embodiment are substantially similar. The active matrix array structure 600 further includes a patterned passivation layer 680 configured between the patterned overcoat layer 360 and the substrate 300. Moreover, in this embodiment, the metal stacked layer structure that forms the gate 314, the scan line 312 and the scan pad 316 includes, for example, a stacked structure of aluminum and molybdenum or a molybdenum/aluminum/molybdenum three-layered stacked structure. Concurrently, the metal structure that forms the data lines 332, the source electrodes 334, the drain electrodes 336 and the data contact pads 338 includes, for example, a stacked layer structure formed with a titanium/aluminum/titanium three-layered metal.

There is a difference between the third photomasking process in this embodiment and the third photomasking process in the first embodiment. In this embodiment, after conducting the second photomasking process and prior to forming the overcoat material layer (not shown), a passivation layer (not shown) is further formed on the substrate 300. In essence, the third photomasking process further includes using a half tone mask to pattern the overcoat material layer (not shown), and performing an etching process to form a patterned passivation layer 680 and a patterned gate insulating layer 350. The parts of the patterned passivation layer 680 and the patterned gate insulating layer 350 that are not covered may respectively have a recessed sidewall E.

Then, an oxygen (plasma) ashing process is performed to form a patterned overcoat layer 360 and to expose a portion of the patterned overcoat layer 680. Thereafter, the transparent conductive layer 370 is globally formed on the substrate 300. Since the exposed borders of the patterned protection layer 680 and the patterned gate insulating layer 350 respectively have a recessed sidewall E, the transparent conductive layer 370 at certain region becomes broken off. Hence, a short circuit due to inappropriate electrical connections is precluded from occurring in each device in the active matrix array structure 600. In other words, the fabrication of an active matrix array structure 600 can be completed by using three photomasks in accordance to the embodiment of the invention. Ultimately, the fabrication cost can be reduced. Moreover, the disposition of the patterned overcoat layer 360 is conducive to improve the display aperture ratio of the liquid crystal display panel having the active matrix array structure 600.

The disposition of the patterned overcoat layer 360 in the active matrix array structure 600 may be as shown in FIG. 12 or in FIG. 13. When the patterned overcoat layer 360 is disposed as shown in FIG. 12 or in FIG. 13, the active matrix array structure 600 may include an isolation line (not shown) or branches (not shown) to preclude a short circuit to occur between the contact pads 316, 338.

Third Embodiment

Figure 16:
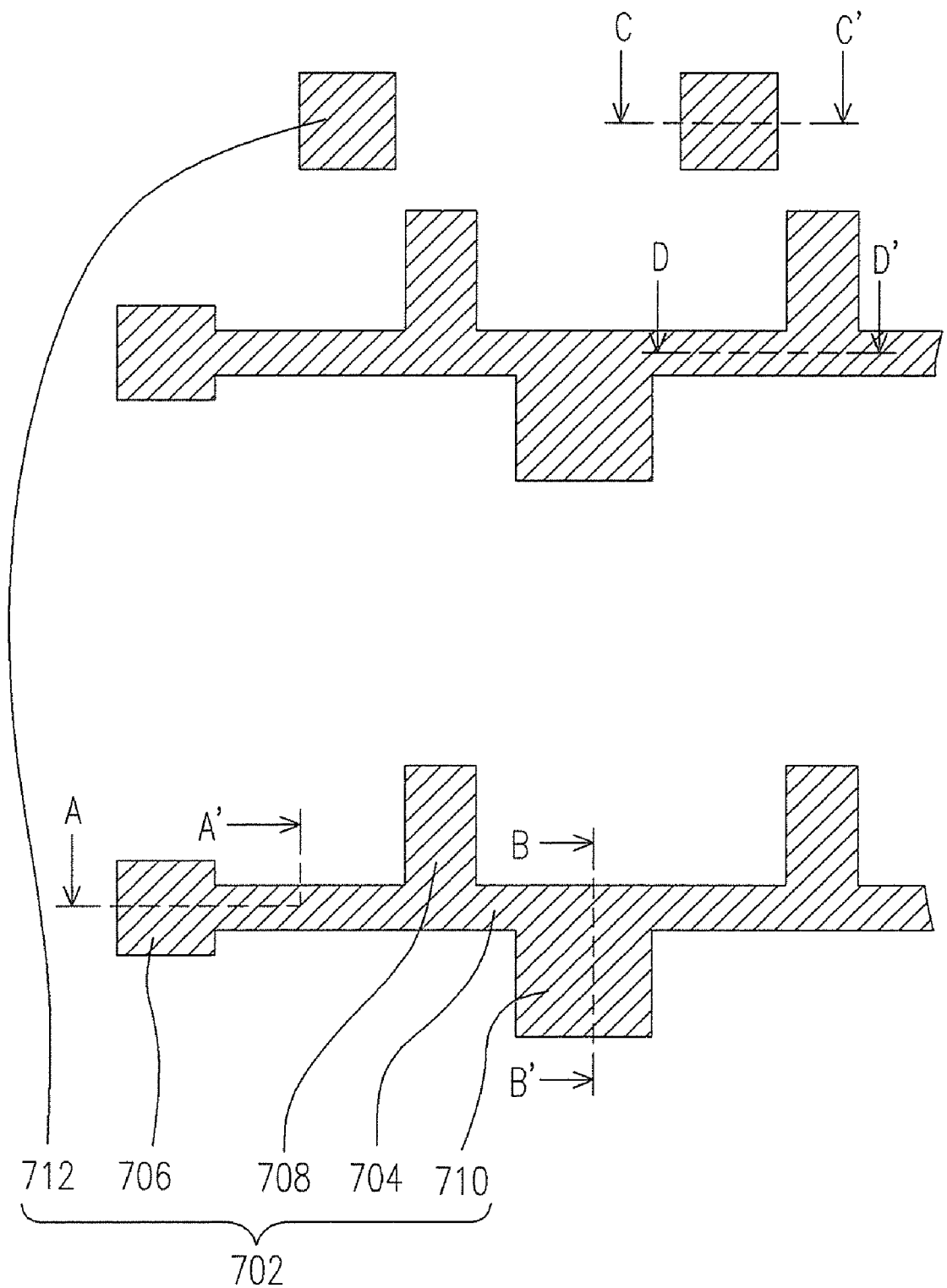
FIG. 16 is a schematic diagram showing the first photomasking process of the active matrix array structure according to the third embodiment of the invention.
Figure 18:
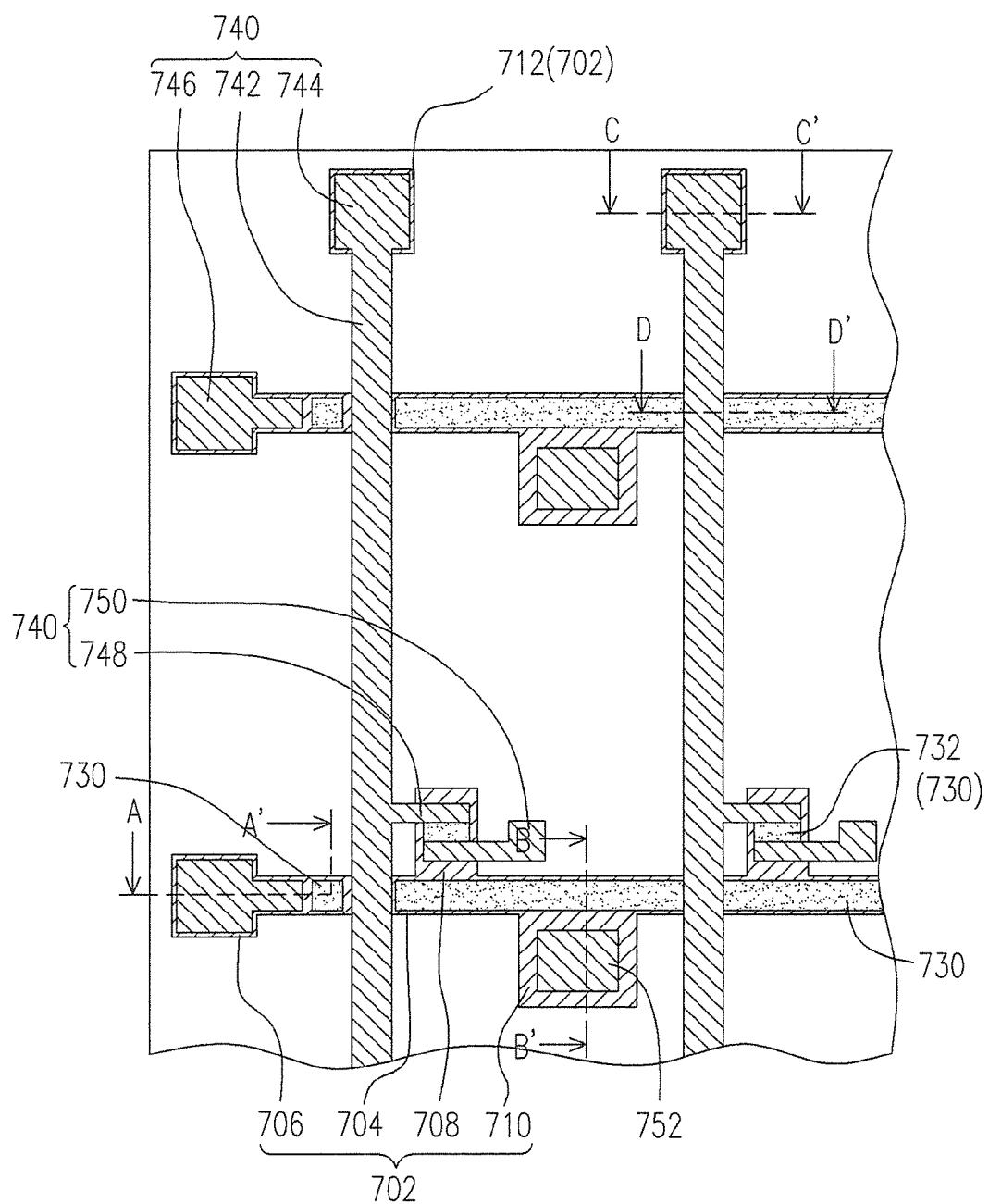
FIG. 18 is a schematic diagram showing the second photomasking process according to the third embodiment of the invention.

FIG. 16 is a schematic diagram illustrating an active matrix array structure according to a third embodiment of the invention. FIGS. 17A to 17D are cross-sectional views of FIG. 16 along the cutting lines AA', BB' CC' and DD'. Referring to FIG. 16 and FIGS. 17A to 17D, a first patterned conductive layer 702 is formed on a substrate 700. The first patterned conductive layer 702 is a stacked layer structure that includes a first aluminum metal layer and a first molybdenum layer. During the first photomasking process, a normal photomask is used to perform photolithograph and etching processes in forming a first patterned conductive layer 702.

Moreover, the first patterned conductive layer 702 includes a scan line 704, a scan contact pad 706, a gate 708, a capacitor lower electrode 710 and an auxiliary pad 712. The scan line 704, the scan contact pad 706, the gate 708 and the capacitor lower electrode 710 are electrically connected. Moreover, the scan contact pad 706 is located at one terminal of the scan line 704, and the gate 708 and the capacitor lower electrode 710 are respectively configured at the corresponding two sides of the scan line 704. In other embodiments, the first patterned conductive layer 702 includes, for example, a molybdenum/aluminum/molybdenum multi-layered metal stacked layer structure, which may include a first molybdenum layer, a first aluminum layer and a second molybdenum layer sequentially stacked on the substrate 700.

FIG. 18 and FIGS. 19A to 19D are schematic views of a second photomasking process according to the third embodiment of the invention. Referring to FIGS. 18, and 19A to 19D, a gate insulating layer 720, a patterned semiconductor layer 730 and a second patterned conductive layer 740 are sequentially formed on a substrate 700. Prior to performing the second photomasking process, the semiconductor material layer (not shown) and the second conductive material layer (not shown) are sequentially formed on the substrate 700. Thereafter, the second photomasking process is performed to form the patterned semiconductor layer 730 and the second patterned conductive layer 740. The second patterned conductive layer 740 includes, for example, a stacked structure constructed with three metals layers of titanium/aluminum/titanium. A part of the patterned semiconductor layer 730 is disposed between the gate insulating layer 720 and the second patterned conductive layer 740.

The second patterned conductive layer 740 may include the data line 742, the data contact pad 744, the auxiliary scan contact pad 746, the source electrode 748, the drain electrode 750 and the capacitor upper electrode 752. The data line 742 and the scan line intersect with each other, and the data contact pad 744 is configured at the terminal of the data line 742. The auxiliary scan pad 746 is disposed above the scan contact pad 706. Moreover the source electrode 748 and the data line 742 are connected, and the source electrode 750 and the drain electrode 748 are respectively disposed at two sides of the gate 708. The capacitor upper electrode 752 is disposed above the capacitor lower electrode 710. A portion of the patterned semiconductor layer 730 is not in between the gate insulating layer 720 and the second patterned conductive layer 740, and the patterned semiconductor layer 730 in between the source electrode 750 and the drain electrode 748 constitutes a channel region 732. The second photomasking process includes applying a half tone photomask to perform the patterning process in order to achieve the effect of etching of various depths. Hence, the number of photomasks used can be decreased to reduce the manufacturing cost.

FIGS. 20A to 20D are cross-sectional views of a dry etching process in the third photomasking process according to a third embodiment of the invention. Referring to FIGS. 20A to 20D, subsequent to the second photomasking process, a passivation layer (not shown) and a pre-patterned overcoat layer 770 are sequentially formed on the substrate 700 according to this embodiment. The pre-patterned overcoat layer 770 includes a first thickness region 772 and a second thickness region 774. Moreover, during the first dry etching process in removing parts of the gate insulating layer 720 and the passivation layer (not shown) that are not covered by the pre-patterned overcoat layer 770, the uncovered portion of the passivation layer (not shown) may form with a recessed sidewall E and a patterned passivation layer 760 is resulted.

In one embodiment, the first thickness region 772 is configured surrounding the auxiliary scan contact pad 746 and the data contact pad 744, and also above the capacitor upper electrode 752, for example. The material of the pre-patterned overcoat layer 770 includes a dielectric material having photosensitive property. Further, a photolithograph process is performed by applying a half tone photomask to pattern the dielectric material to form a pre-patterned overcoat layer 770 with various thicknesses.

Figure 21C:
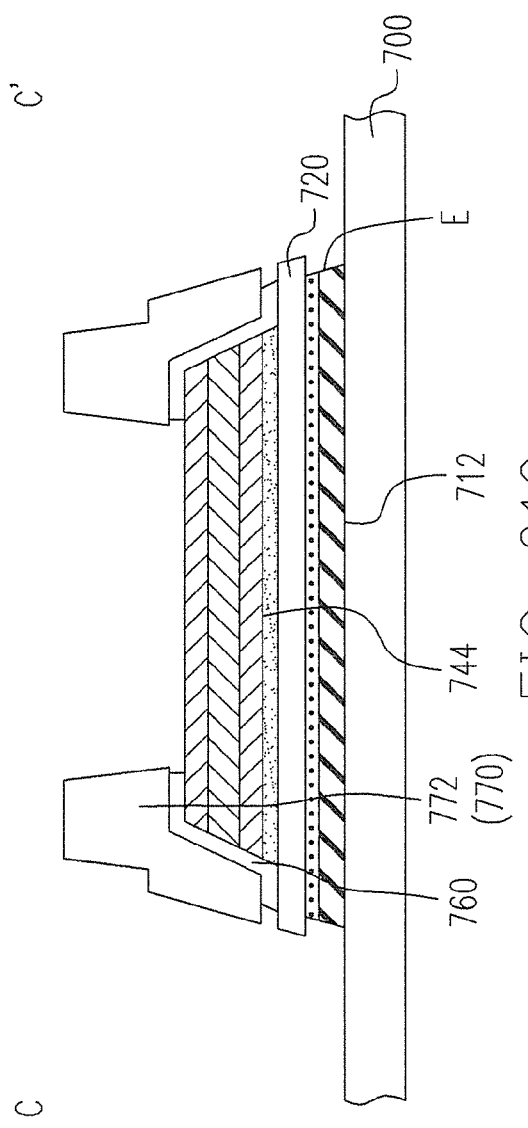
Figure 21D:
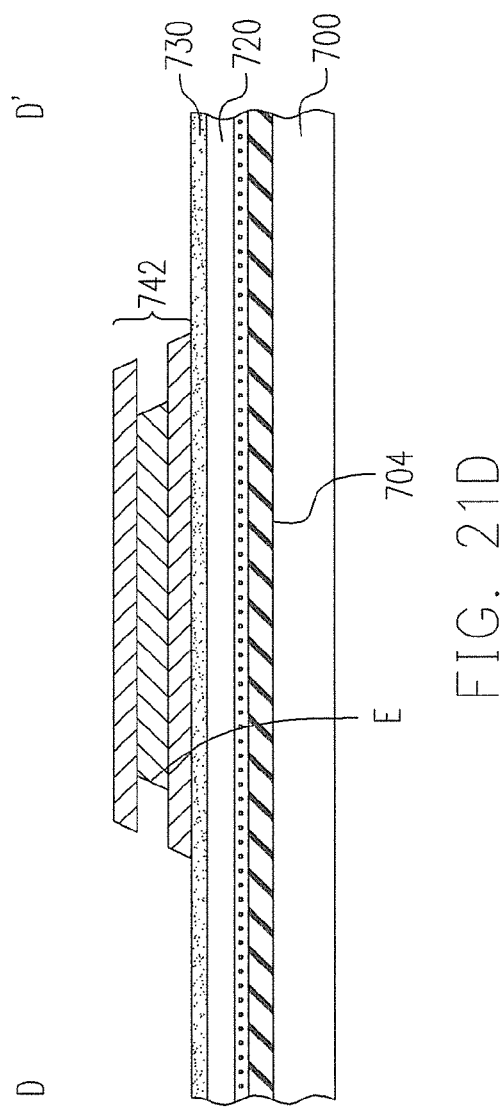

FIGS. 21A to 21D are cross-sectional views of a wet etching process in the third photomasking process according to a third embodiment of the invention. Referring to FIGS. 21A to 21D, a wet etching process is performed, and the uncovered portions of the scan contact pad 706 and the auxiliary pad 712 are respectively formed with a recessed sidewall E. The etchants used in the wet etching process of this embodiment include the etchants that are suitable for removing aluminum and molybdenum. Accordingly, the exposed parts of the metal of the auxiliary pad 712 and the scan pad 706 are also removed, and the auxiliary pad 712 and the scan pad 706 are respectively formed with a recessed sidewall E. Moreover, the second patterned conductive layer 740 is a titanium/aluminum/titanium stacked structure, and the exposed aluminum metal layer in the second patterned conductive layer 740 is also formed with a recessed sidewall E (as shown in FIG. 21D). Hence, in the above-mentioned wet etching process, a portion of the second patterned conductive layer 740 located at the intersection of the scan line 704 and the corresponding data line 742 also has a recessed sidewall E (as shown in FIG. 21D).

FIGS. 22A to 22D are cross-sectional views of a second dry etching process in the third photomasking process according to the third embodiment of the invention. Referring to FIGS. 22A to 22D, a second dry etching process is performed to remove a portion of the patterned semiconductor layer 730 and a portion of the gate insulating layer 720 that are not covered by the pre-patterned overcoat layer 770 to form a patterned gate insulating layer 722. The second dry etching process includes, for example, removing portions of the patterned semiconductor layer 730 and the gate insulating layer 720 above the scan contact pad 706 and the scan line 704 to expose a portion of the scan contact pad 706 and the scan line 730. The patterned semiconductor layer 730 at the intersection of the scan line 704 and the data line 742 has a recessed sidewall E. The patterned gate insulating layer 722 includes a plurality of first openings 724, for example. A portion of the first openings 724 exposes the scan line 704 and the scan contact pad 706, and other portion of the first openings 724 exposes the substrate 700.

FIGS. 23A to 23D are cross-sectional views of an oxygen (plasma) ashing process in the third photomasking process according to the third embodiment of the invention. Referring to FIGS. 23A to 23D, an oxygen (plasma) ashing process is performed to remove a portion of the pre-patterned overcoat layer 770 of the first thickness region 772 to form a patterned overcoat layer 776 that exposes a portion of the patterned passivation layer 760. The exposed patterned passivation layer 760 is configured near the auxiliary scan pad 746, above the capacitor upper electrode 752 and near the data contact pad 774. Moreover, the patterned overcoat layer 776 includes a plurality of second openings 778, wherein a portion of the second openings 778 and a portion of the first openings 724 are connected together to expose a portion of the scan line 704 and a portion of the substrate 700.

FIGS. 24A to 24D are cross-sectional views of an active matrix array structure according to the third embodiment of the invention. FIG. 25 is a top view of the active matrix array structure according to the third embodiment. Referring to FIGS. 24A to 24D and 25, a transparent conductive layer 780 is globally formed on the substrate 700 to complete the fabrication of an active matrix array structure 790. The material of the transparent conductive layer 780 includes an indium-tin-oxide material or an indium-zinc-oxide material. Moreover, the exposed sidewalls of the first patterned conductive layer 702, the patterned semiconductor layer 730, the second patterned conductive layer 740 and the patterned passivation layer 730 respectively have a recessed structure. Hence, the transparent conductive layer 780 is discontinued at the positions of the sidewalls E to provide an electrical insulation between certain devices of the active matrix array structure 790.

From the cross-sectional view of FIG. 24A along the cutting line AA', each scan contact pad 706 has a recessed sidewall E. Moreover, the patterned passivation layer 760 between the patterned gate insulating layer 722 and the patterned overcoat layer 776 respectively has a recessed sidewall E structure. Accordingly, the transparent conductive layer 780 is broken off around the scan pad 706 for each scan contact pad 706 to maintain electrical independence. Moreover, the patterned semiconductor layer 730 has at least a third opening 734, and the scan contact pad 706 and the auxiliary scan contact pad 746 corresponding to the third opening 734 are electrically connected via the transparent conductive layer 780. The scan contact pad 706 is electrically connected to devices, such as an exterior circuit or a driving chip, via the auxiliary scan contact pad 746 configured above.

Referring to the cross-sectional view of FIG. 24B along the cutting line BB' in FIG. 25, the patterned passivation layer 760 above the scan line 704 has a recessed sidewall structure to break off the transparent conductive layer 780. Accordingly, the scan line 704 is precluded from being electrically connected with, via the transparent conductive layer 780, the devices constructed from the second patterned conductive layer 740. Moreover, the capacitor upper electrode 752 is directly connected with the transparent conductive layer 780 in this embodiment. Hence, the capacitance effect of the capacitor upper electrode 752 and the capacitor lower electrode 710 of the capacitor in the active matrix array structure 790 improves the stability of the display voltage in the liquid crystal display panel.

Figure 24C:
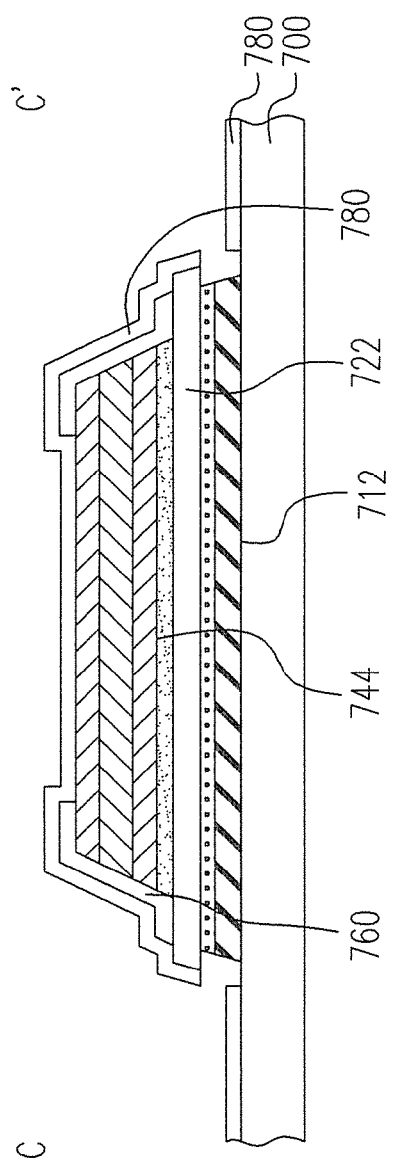
Figure 24D:
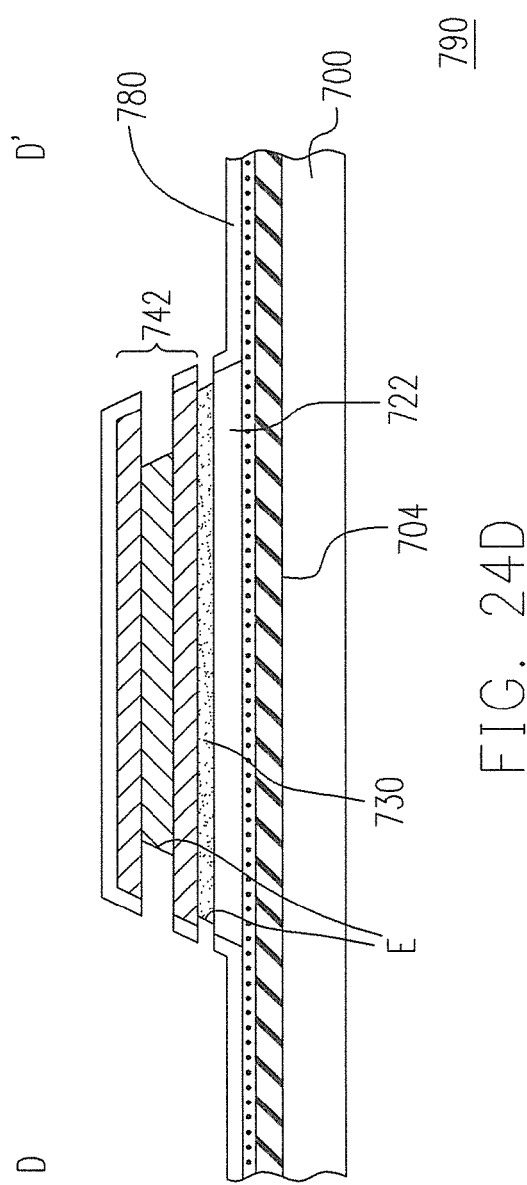
Figure 25:
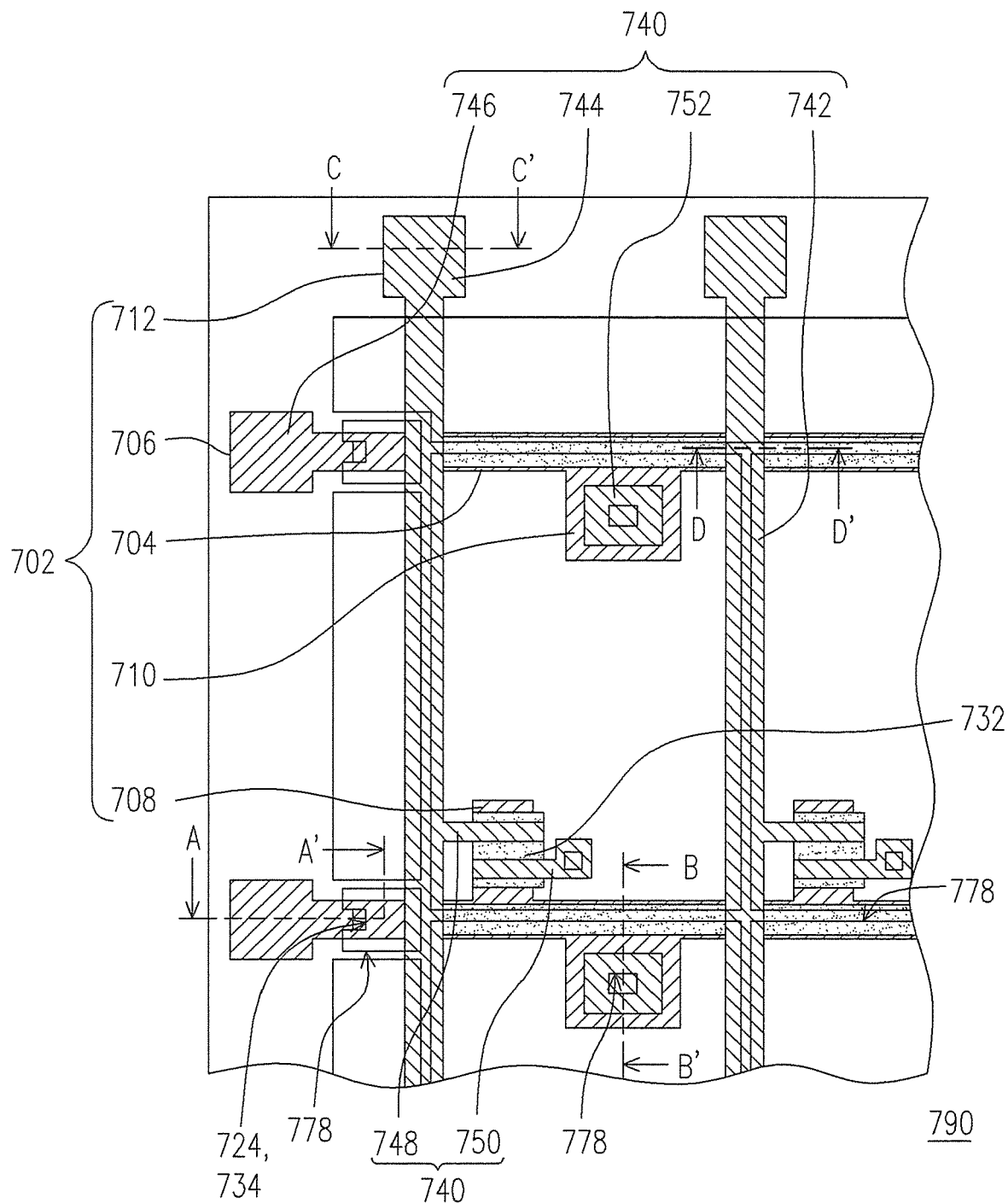
FIG. 25 is a schematic diagram showing the active matrix array structure according to the third embodiment of the invention.

In the cross-sectional view of FIG. 24C, the auxiliary pad 712 under the data contact pad 744 has a recessed sidewall structure; hence, each data contact pad 744 can be electrically insulated from each other or from each scan contact pad 706. Moreover, the disposition of the auxiliary pad 712 increases the height of the data contact pad 744, and the data contact pad 744 is configured at about the same height as the auxiliary scan contact pad 746 configured above the scan contact pad 706. Accordingly, when the active matrix array structure 790 is connected with devices, such as an exterior driving circuit or a chip, the exterior driving circuit or the chip and the contact pads (706, 746) are connected at about the same height to enhance the process efficiency.

Moreover, in the cross-sectional views of 24D along the cutting line DD', corresponding to the cross-over point between the scan line 704 and the data line 742, the patterned semiconductor layer 730 has a recessed sidewall E. Hence, the transparent conductive layer 780 is precluded from electrically connecting the scan line 704 with the data line 742. In the corresponding data line 742, the aluminum metal layer has a recessed structure the scan line 704 to be electrically insulated from the data line 742. In essence, the transparent conductive layer 780 of the embodiments is globally formed on the substrate 700, and each device of the active matrix array structure 790 is maintained to be electrically connected or electrically insulated. Therefore, the transparent conductive layer 780 does not have to be patterned, and the manufacturing cost can be further reduced.

In accordance to the above, after the first photomasking process of the invention, two half tone photomasks are respectively used in different patterning processes. Further relying on different etching processes, some of the film layers are formed with recessed sidewalls. Hence, each device in the active matrix array structure of the invention can maintain its own independent electrical characteristics. Moreover, the fabrication of the active matrix array structure of the invention requires only three photomasks. Therefore, the manufacturing cost can be reduced. Additionally, the active matrix array structure includes an overcoat layer. The parasitic capacitance between the transparent electrode layer and the scan line or the data line can be effectively reduced. When the active matrix array structure of the invention is applied to a liquid display panel, the transparent conductive layer and the data line partially overlapped is profitable to increase the display aperture ratio and the display quality of the liquid crystal display panel.

It will be apparent to those skilled in the art that various modifications and variations can be made to the structure of the invention without departing from the scope or spirit of the invention. In view of the foregoing descriptions, it is intended that the invention covers modifications and variations of this invention if they fall within the scope of the following claims and their equivalents.

What is claimed is:

1. An active matrix array structure, disposed on a substrate, the active matrix array structure comprising:
    a first patterned conductive layer, configured on the substrate, wherein the first patterned conductive layer comprises a plurality of scan lines, a plurality of gates and a plurality of scan contact pads that are connected with the plurality of the scan lines;
    a patterned gate insulating layer, comprising a plurality of first openings that expose a portion of the first patterned conductive layer;
    a patterned semiconductor layer, disposed on the patterned gate insulating layer;
    a second patterned conductive layer, directly disposed on the patterned semiconductor layer, and the second patterned conductor layer comprising a plurality of data lines, a plurality of drain electrodes, a plurality of source electrodes and a plurality of data contact pads that are connected with the plurality of data lines, wherein the data lines and the scan lines intersect, and the drain electrodes and the source electrodes are configured above the gates;
    a patterned overcoat layer, wherein the patterned overcoat layer comprises a plurality of second openings, wherein the plurality of the second openings configured above the first openings expose the portion of the first patterned conductive layer exposed by the first openings, and a portion of the plurality of the second openings exposes a portion of the second patterned conductive layer; and
    a transparent conductive layer, globally disposed on the substrate, wherein a portion of the transparent conductive layer disposed in the first openings and the second openings is broken off at a position that is in between the substrate and the patterned overcoat layer.

2. The structure of claim 1, wherein the first patterned conductive layer comprises a stacked layer of a first aluminum metal layer and a first titanium metal layer, wherein the second patterned conductive layer comprises a stacked layer of a second aluminum metal layer and a second titanium metal layer.

3. The structure of claim 2, wherein the first titanium metal layer is disposed between the first aluminum metal layer and the substrate.

4. The structure of claim 3, wherein the first aluminum metal layer exposed by the first openings comprises a recessed sidewall wherein the recessed sidewall is recessed with respect to a sidewall of a layer above.

5. The structure of claim 2 wherein the second titanium metal layer is disposed between the second aluminum metal layer and the patterned semiconductor layer.

6. The structure of claim 5, wherein a portion of the second openings exposes a portion of the data contact pads and the second aluminum metal layer in the data lines, and the data contact pads and the data lines that are exposed respectively comprise a recessed sidewall.

7. The structure of claim 5, wherein the portion of the plurality of the second openings exposes the drain electrodes, and the second aluminum metal layer comprises a recessed sidewall near the corresponding gates.

8. The structure of claim 1, wherein the first patterned conductive layer further comprises a stacked layer of a first aluminum metal layer and a first molybdenum metal layer, and the second patterned conductive layer comprises sequentially a first titanium metal layer, a second aluminum metal layer and a second titanium metal layer.

9. The structure of claim 8, wherein the first patterned conductive layer further comprises a second molybdenum metal layer, and the first aluminum metal layer is disposed between the first molybdenum metal layer and the second molybdenum metal layer.

10. The structure of claim 8 further comprising a patterned passivation layer, and the patterned overcoat layer is configured between the patterned passivation layer and the transparent conductive layer.

11. The structure of claim 10, wherein the plurality of the second openings exposes the data contact pads, and the patterned passivation layer comprises a recessed sidewall in between the data contact pads and the patterned overcoat layer.

12. The structure of claim 10, wherein when the patterned overcoat layer, the patterned passivation layer and the patterned gate insulating layer are tightly stacked, and the patterned passivation layer comprises a recessed sidewall at the location where the first openings are respectively connected with the second openings.

13. The structure of claim 10, wherein the portion of the plurality of the second openings exposes the drain electrodes, and the patterned passivation layer comprises a recessed sidewall in proximity to the corresponding gates.

14. The structure of claim 10, wherein the portion of the plurality of the second openings exposes the data lines, and the patterned passivation layer comprises a recessed sidewall in between the data lines and the patterned overcoat layer.

15. The structure of claim 10, wherein a portion of the patterned semiconductor layer further disposes between the patterned passivation layer and the patterned gate insulating layer, and locates above the scan contact pads and the scan lines.

16. The structure of claim 15, wherein a portion of the first openings exposes the scan lines and the scan contact pads, and above the scan lines, the patterned passivation layer comprises a recessed sidewall in between the patterned semiconductor layer and the patterned overcoat layer.

17. The structure of claim 15, wherein the second patterned conductive layer further comprises a plurality of auxiliary scan pads, configured above the scan pads, and the transparent conductive layer electrically connects the auxiliary scan pads respectively with the corresponding scan contact pads through the first openings in between the patterned semiconductor layer and the scan contact pads.

18. The structure of claim 8, wherein the first openings expose a border of the scan contact pads, and the first patterned conductive layer at the border of the scan contact pads comprises a recessed sidewall.

19. The structure of claim 8, wherein the portion of the first patterned conductive layer further comprises a plurality of auxiliary pads, configured in between the data contact pads and the substrate, and the auxiliary pads respectively comprise a recessed sidewall.

20. The structure of claim 8, wherein at intersections between the data lines and the scan lines, the second aluminum layer and the patterned semiconductor layer respectively comprise a recessed sidewall.

21. The structure of claim 1, wherein at intersections between the data lines and the scan lines, the patterned gate insulating layer comprises a recessed sidewall.

22. The structure of claim 1, wherein the first patterned conductive layer further comprises a plurality of capacitor electrodes extended from the scan lines to between the drain electrodes and the substrate.

23. The structure of claim 1, wherein the second conductive layer further comprises a plurality of capacitor electrodes, and the scan lines are configured in between the capacitor electrodes and the substrate, and the capacitor electrodes and the drain electrodes are electrically connected.

* * * * *